US010003175B2

(12) United States Patent
Kondo et al.

(10) Patent No.: US 10,003,175 B2
(45) Date of Patent: Jun. 19, 2018

(54) EXTERNAL-RESONATOR-TYPE LIGHT-EMITTING DEVICE

(71) Applicant: NGK INSULATORS, LTD., Nagoya (JP)

(72) Inventors: Jungo Kondo, Miyoshi (JP); Shoichiro Yamaguchi, Ichinomiya (JP); Tetsuya Ejiri, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days. days.

(21) Appl. No.: 15/375,550

(22) Filed: Dec. 12, 2016

(65) Prior Publication Data

US 2017/0093126 A1    Mar. 30, 2017

Related U.S. Application Data

(63) Continuation of application No. PCT/JP2015/066923, filed on Jun. 11, 2015.

(30) Foreign Application Priority Data

Jun. 13, 2014  (JP) ................................. 2014-122620

(51) Int. Cl.
*H01S 5/00* (2006.01)
*H01S 5/14* (2006.01)
(Continued)

(52) U.S. Cl.
CPC ............ *H01S 5/141* (2013.01); *H01S 5/1003* (2013.01); *H01S 5/1014* (2013.01);
(Continued)

(58) Field of Classification Search
CPC .......... H01S 5/141; H01S 5/14; H01S 5/1025; H01S 5/10; H01S 5/1003; H01S 5/1014; H01S 5/1237
See application file for complete search history.

(56) References Cited

U.S. PATENT DOCUMENTS 5,993,073 A * 11/1999 Hamakawa .......... G02B 6/4204
                                                     385/88
6,091,744 A    7/2000 Sorin et al.
(Continued)

FOREIGN PATENT DOCUMENTS

JP          49-128689 A1    12/1974
JP          56-148880 A1    11/1981
(Continued)

OTHER PUBLICATIONS

English translation of Written Opinion (Application No. PCT/JP2015/066923) of the International Search Authority dated Dec. 22, 2016.
(Continued)

*Primary Examiner* — Kinam Park
(74) *Attorney, Agent, or Firm* — Burr & Brown, PLLC

(57) ABSTRACT

An external resonator type light-emitting device includes a light source oscillating a semiconductor laser light and a grating element configuring an external resonator together with the light source. The light source includes an active layer oscillating the semiconductor laser light. The grating element includes an optical waveguide and a plurality of Bragg gratings formed in the optical waveguide. The optical waveguide includes an incident face on which the semiconductor laser light is incident and an emitting face from which an emitting light having a desired wavelength is emitted.

6 Claims, 14 Drawing Sheets

(51) Int. Cl.
*H01S 5/12* (2006.01)
*H01S 5/10* (2006.01)

(52) U.S. Cl.
CPC .......... *H01S 5/1025* (2013.01); *H01S 5/1237* (2013.01); *H01S 5/14* (2013.01); *H01S 5/146* (2013.01); *H01S 5/10* (2013.01)

(56) References Cited

U.S. PATENT DOCUMENTS

| | | | |
|---|---|---|---|
| 6,295,306 | B1 | 9/2001 | Asami |
| 6,301,408 | B1* | 10/2001 | Espindola .......... G02B 6/02104 385/37 |
| 6,391,214 | B1 | 5/2002 | Kovacic |
| 6,693,946 | B2* | 2/2004 | Wilson .................... H01S 5/146 372/102 |
| 7,424,044 | B2 | 9/2008 | Zheng et al. |
| 7,653,317 | B2 | 1/2010 | Ohki et al. |
| 2003/0108081 | A1 | 6/2003 | Ryu et al. |
| 2004/0131102 | A1* | 7/2004 | Jette ....................... B82Y 20/00 372/97 |
| 2005/0018741 | A1* | 1/2005 | Nomaguchi .............. H01S 5/12 372/96 |
| 2009/0290613 | A1 | 11/2009 | Zheng et al. |
| 2014/0362886 | A1 | 12/2014 | Kondo et al. |
| 2017/0093127 | A1* | 3/2017 | Kondo .................... H01S 5/146 |

FOREIGN PATENT DOCUMENTS

| | | |
|---|---|---|
| JP | 07-035933 A1 | 2/1995 |
| JP | 10-084168 A1 | 3/1998 |
| JP | 10-293234 A1 | 11/1998 |
| JP | 11-040883 A1 | 2/1999 |
| JP | 11-251690 A1 | 9/1999 |
| JP | 2000-082864 A1 | 3/2000 |
| JP | 2002-006148 A1 | 1/2002 |
| JP | 2002-134833 A1 | 5/2002 |
| JP | 2003-069147 A1 | 3/2003 |
| JP | 3667209 B2 | 7/2005 |
| JP | 2006-222399 A1 | 8/2006 |
| JP | 2007-081215 A1 | 3/2007 |
| JP | 2010-171252 A1 | 8/2010 |
| JP | 5641631 B1 | 12/2014 |
| WO | 01/22544 A1 | 3/2001 |
| WO | 2005/031930 A1 | 4/2005 |
| WO | 2013/034813 A2 | 3/2013 |
| WO | 2014/196553 A1 | 12/2014 |

OTHER PUBLICATIONS

U.S. Appl. No. 15/375,587, filed Dec. 12, 2016, Kondo, et al.
Kazunori Yamada, et al., "Highly Accurate Wavelength Control of External Cavity Laser Module with Fiber Grating," *Transactions on Fundamentals of Electronics, Communications and Computer Sciences*, C—II, 1998, vol. J81, No. 7, pp. 665-665.
Yujin Zheng, et al., "High-Brightness Narrow-Bandwidth High-Power Laser Diode Array Based on an External-Cavity Technique," *Technical Reports on Fundamentals of Electronics, Communications and Computer Sciences*, LQE, 2005, vol. 105, No. 7, pp. 17-20.
Akira Mugino, et al., "Output Power Optimization of 980 nm Pump Lasers Wavelength-Locked Using Fiber Bragg Grating," *Furukawa Review*, Jan. 2000, No. 105, pp. 24-29.
Handbook of Semiconductor Lasers and Photonic Integrated Circuit, edited by Y. Suematsu and A.R.Adams, 1994, pp. 363-374.
International Search Report and Written Opinion (Application No. PCT/JP2015/066923) dated Aug. 25, 2015.

* cited by examiner

Laser oscillation condition:

$$C_{out}^2 r_1 r_2 \exp\{(\xi_{th}g_{th}-\alpha_a)L_a\} \times \exp\{-j(2\beta_a L_a)\} = 1$$

Gain condition:
$$g_{th} = \frac{1}{\xi_{th}}\left\{\alpha_a + \frac{1}{L_a}\ln\left(\frac{1}{C_{out}^2 r_1 r_2}\right)\right\}$$

Phase condition:
$$2\beta_a L_a = 2\pi m$$

EXTERNAL-RESONATOR-TYPE LIGHT-EMITTING DEVICE

TECHNICAL FIELD

The present invention relates to an external resonator type light-emitting device using a grating element.

BACKGROUND ARTS

The Fabry-Perot (FP) type including an optical resonator flanked by mirrors provided on both end faces of an active layer has been generally utilized for a semiconductor laser. However, according to this FP type laser, light is oscillated at a wavelength satisfying conditions for oscillating standing waves. The longitudinal mode thus tends to be of multi-mode, and the oscillation wavelength is changed particularly when a current or temperature is changed, resulting in a change of optical intensity.

Therefore, for the purpose of optical communication, gas sensing and so forth, required is a laser capable of a single mode oscillation with high wavelength stability. For this reason, a distributed feed-back type (DFB) laser and a distributed Bragg reflection type (DBR) laser have been developed. Such a laser, a diffraction grating is provided in a semiconductor to oscillate only light of a specific wavelength by utilizing wavelength dependency thereof.

In order to realize a semiconductor laser that exhibits wavelength stability, the DBR laser and the DFR laser each in which gratings are formed monolithically in the semiconductor laser, and an external resonator type laser in which a fiber Bragg grating (FBG) is fixed as a grating to the outside of a laser can be exemplified. These are based on the principle by which a part of laser light is fed back to the laser with a wavelength selective mirror utilizing Bragg reflection to realize an operation for wavelength stability.

According to the DBR laser, concaves and convexes are formed on the surface of a waveguide extended from the waveguide of the active layer to configure a mirror by utilizing Bragg reflection for realizing a resonator (Patent document 1; JP S49-128689 A: Patent document 2; JP 856-148880 A). Since diffraction gratings are provided on both ends of an optical waveguide layer according to this laser, light emitted from the active layer is propagated through the optical waveguide layer; a part of the propagating light is reflected by the diffraction gratings and returned into a current injection part; and then amplified. As light having only a specific wavelength is reflected in the determined direction from the diffraction grating, the wavelength of the laser light is made constant.

Further, as the application, an external resonator type semiconductor laser, for which diffraction gratings are used as parts different from the semiconductor, and an external resonator is formed, has been developed. This type of laser provides lasers each exhibiting excellent wavelength stability, temperature stability and controllability. The external resonator includes a fiber Bragg grating (FBG) (Non-patent document 1) and a volume holographic grating (VHG) (Non-patent document 2). Since the diffraction grating is composed of a member different from a semiconductor laser, it is a feature that the reflectance as well as the length of the resonator can be independently designed, and it is not affected by the influence of a rise in temperature caused by heat generation via current injection, and thus the wavelength stability can be further improved. Further, the semiconductor exhibits different temperature change of refractive index therefrom, and thus the temperature stability can be improved by designing the foregoing together with the length of the resonator.

An external resonator type laser, in which gratings formed in a quartz glass waveguide are utilized, has been disclosed in Patent document 6 (JP 2002-134833 A). This aims at providing a frequency stabilized laser which can be used in an environment under which the room temperature is largely changed with no temperature controller (for example, a temperature of 30° C. or higher). It is also described that mode hopping is suppressed, and a temperature independent laser exhibiting no temperature dependency on the oscillation frequency is provided.

Further, it has been proposed that a plurality of Bragg gratings is formed in an optical fiber to stabilize a wavelength (Patent document 7).

An external resonator type light-emitting device, provided with a light source by which semiconductor laser light is oscillated and a plurality of Bragg gratings each having a different period, has been disclosed in Patent document 8. The reflection characteristics of the Bragg gratings each are independent and are not crossed with each other, thereby possessing no reflection characteristics having a continuously broad wavelength. Further, the present device provides the concept such that gratings and a phase adjusting region have been formed on the light source side, and the wavelength is varied by the action of this phase adjusting region to realize excellent wavelength stability even upon temperature change.

[Non-patent document 1] Transactions on Fundamentals of Electronics, Communications and Computer Sciences C-II Vol. J81, No. 7, pp. 664-665, July 1998
[Non-patent document 2] Technical Reports on Fundamentals of Electronics, Communications and Computer Sciences LQE, Vol. 105, No. 52, pp. 17-20, 2005
[Non-patent document 3] Furukawa Review No. 105, pp. 24-29, January 2000
[Patent document 1] JP S49-128689 A
[Patent document 2] JP S56-148880 A
[Patent document 3] WO 2013/034813 A
[Patent document 4] JP 2000-082864 A
[Patent document 5] JP 2006-222399 A
[Patent document 6] JP 2002-134833 A
[Patent document 7] JP 2002-006148 A
[Patent document 8] US 2003/0108081 A1

SUMMARY OF THE INVENTION

The non-patent document 1 refers to a mechanism of mode hopping which deteriorates wavelength stability as a result of a rise in temperature and how to improve it. A wavelength change amount $\delta\lambda_s$ of an external resonator laser depending on temperature is expressed as the following formula under the standing wave condition. Refractive index change of an active layer region of a semiconductor which is represented by $\Delta na$, length of the active layer which is represented by La, refractive index change and length of the FBG region which are represented by $\Delta nf$ and Lf, respectively, and temperature changes of them which are represented by $\delta Ta$ and $\delta Tf$, respectively.

$$\delta\lambda_s = \lambda_0 \frac{\Delta n_a L_a}{n_f L_f + n_a L_a} \delta T_a + \lambda_0 \frac{\Delta n_f L_f}{n_f L_f + n_a L_a} \delta T_f \quad (1)$$

Here, λ0 represents a grating reflection wavelength at the initial state.

Further, a change of the grating reflection wavelength which is represented by δλG is expressed as the following formula.

$$\delta\lambda_G = \lambda_0 \frac{\Delta n_f}{n_f} \delta T_f \quad (2)$$

The mode hopping is generated when a longitudinal mode interval Δλ of the external resonator equals to the difference between a wavelength change amount $\delta\lambda_s$ and an amount of change in grating reflection wavelength $\delta\lambda_G$, and thus the following formula is satisfied.

$$\Delta\lambda = \delta\lambda_s - \lambda_0 \frac{\Delta n_f}{n_f} \delta T_f \quad (3)$$

The longitudinal mode interval Δλ is approximately expressed as the following formula.

$$\Delta\lambda = \frac{\lambda_0^2}{2(n_f L_f + n_a L_a)} \quad (4)$$

Mathematical formula (5) is satisfied based on the mathematical formulae (3) and (4).

$$\Delta T_{all} = \frac{\lambda_0}{2 n_a L_a \left( \frac{\Delta n_a}{n_a} - \frac{\Delta n_f}{n_f} \right)} \quad (5)$$

In order to suppress the mode hopping, it is necessary to use the external resonator laser within a temperature of ΔTall or less, thereby controlling the temperature by using a Peltier element. According to the mathematical formula (5), in the case where reflective index changes of the active layer and the grating layer are identical to each other, as to (Δna/na=Δnf/nf), the denominator becomes zero and the temperature at which the mode hopping is generated becomes infinite, thereby indicating that there is no mode hopping any more. However, in the case of a monolithic DBR laser, since the active layer is subjected to current injecting for laser oscillation, refractive index changes of the active layer and the grating layer cannot coincide with each other, resulting in generation of the mode hopping.

The mode hopping is a phenomenon in which the oscillating mode (longitudinal mode) in a resonator is shifted from one mode to another mode. When the temperature or injection current varies, conditions of the gain and resonator become different therefrom and thus the wavelength of the laser oscillation is changed, resulting in generation of a problem called kink such that optical power is to be varied. Accordingly, in the case of an FP type GaAs semiconductor laser, the wavelength is conventionally changed at a temperature coefficient of 0.3 nm/° C. But when the mode hopping is generated, a variation larger than the foregoing occurs. At the same time, an output power thereof varies by 5% or more.

For this reason, in order to suppress the mode hopping, a Peltier element is used for controlling the temperature. However, as a result, a number of parts are increased, and thus the module becomes larger in size, resulting in a high cost.

According to the patent document 6, in order to realize temperature independency, in the case of a conventional resonator structure when it is used as it is, a stress is applied to an optical waveguide layer to compensate a temperature coefficient caused by the thermal expansion to realize the foregoing temperature independency. Therefore, a metal plate is attached onto the element, and a layer that adjusts the temperature coefficient is further added in the waveguide. For this reason, there appears a problem such that the resonator structure becomes larger in size.

Further, as described in the patent document 7, it appears that it can be used in a wide range of temperatures by providing a plurality of Bragg gratings in the grating element. In this case, the grating element generally has a length of 1 mm or more, and the wavelength width (full width at half maximum, FWHM) of reflectance is set to 1 nm or less. By this, an external resonator type laser that exhibits high wavelength stability, which has suppressed the mode hopping can be realized.

However, practically, there is a limit in improving temperature stability of the whole external resonator type light-emitting device, and thus temperature control mechanisms such as a Peltier element and so forth should be used. Thus, it is desired to improve stability with respect to temperature changes of a laser light source.

An object of the present invention is, in an external resonator type light-emitting device using a grating element, to provide a structure by which stability with respect to the temperature change is improved.

The present invention provides an external resonator type light-emitting device comprising a light source oscillating a semiconductor laser light and a grating element configuring an external resonator with the light source:

wherein the light source comprises an active layer oscillating the semiconductor laser light; and wherein the grating element comprises an optical waveguide comprising an incident face to which the semiconductor laser light is incident and an emitting face from which an emitting light having a desired wavelength is emitted, and a plurality of Bragg gratings formed in the optical waveguide.

According to the present invention, a plurality of Bragg gratings are provided in the grating element. An intermediate propagating portion having no grating is preferably provided between the Bragg gratings adjacent to each other, but Bragg gratings each having a different central wavelength may be provided continuously with no space between them.

Focusing on individual grating elements, oscillation with the Bragg gratings are possible in a wavelength region in which the Bragg grating has higher reflectance than that at an emitting end of the light source. Then, when the environmental temperature is changed, the wavelength of laser light oscillating from the light source is shifted. At this time, the wavelength region of the Bragg gratings having the adjacent central wavelength can be appropriately adjusted. Thus, even when the wavelength of the laser light oscillating from the light source is shifted, it becomes possible to provide the design by which neighboring Bragg gratings are allowed to function, responsive to the shift of the wavelength. The temperature stability is thereby largely improved as a whole device.

DETAILED DESCRIPTION OF THE INVENTION

Figure 1:
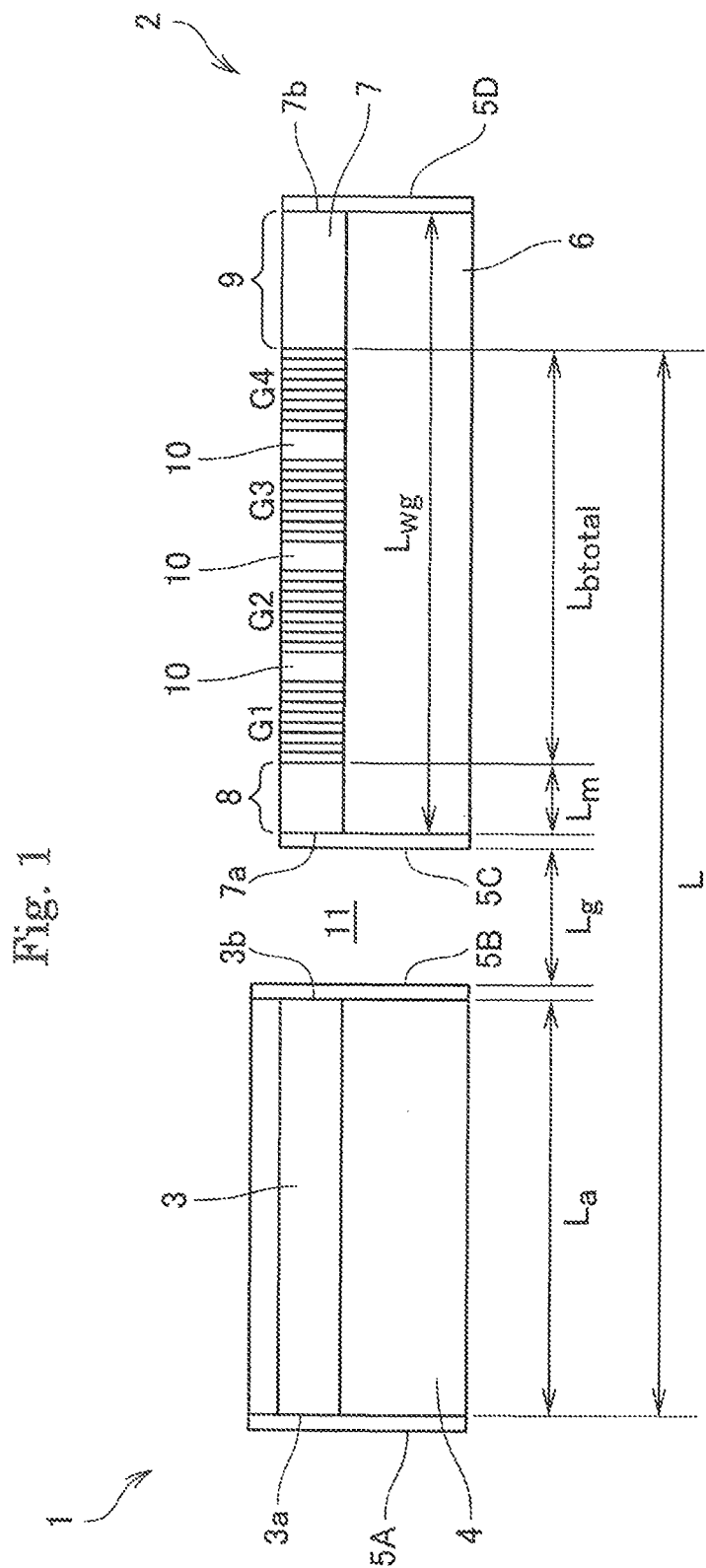
FIG. 1 is a view schematically showing an external resonator type light-emitting device.

An external resonator type light-emitting device schematically shown in FIG. 1 includes a light source 1 oscillating a semiconductor laser light, and a grating element 2. The light source 1 and the grating element 2 may be mounted on a common substrate not shown in the figure.

The light source 1 includes an active layer 3 oscillating the semiconductor laser light. According to the present embodiment, the active layer 3 is provided on a substrate 4. A reflection film 5A is provided on an outer end face 3a of the active layer 3, and an antireflection film (or a reflection film) 5B is formed on an end face 3b provided on the grating element side of the active layer 3. Symbol La represents the length in the direction of an optical axis of the active layer.

In the grating element 2, it is provided an optical waveguide 7 including an incident face 7a to which the semiconductor laser light is incident and an emitting face 7b from which emission light having a desired wavelength is emitted, on a supporting substrate 6. A plurality of Bragg gratings G1, G2, G3 and G4 are formed in the optical waveguide 7. According to the present example, the number of the Bragg gratings is 4, but may be 2 or more. Each of intermediate propagating portions 10 which has no diffraction grating is provided between the Bragg gratings adjacent to each other.

An incident side propagating portion 8 having no diffraction grating is provided between the incident face 7a of the optical waveguide 7 and the Bragg grating G1, and the incident side propagating portion 8 and the active layer 3 are facing to each other via a spacing 11. Symbol 5C represents an antireflection film provided on the incident face side of the optical waveguide 11. An emitting side propagating portion 9 having no diffraction grating is provided between the emitting face 7b of the optical waveguide 7 and the Bragg grating G4, and symbol 5D represents an antireflection film provided on the emitting face side of the optical waveguide 11.

Figure 2:
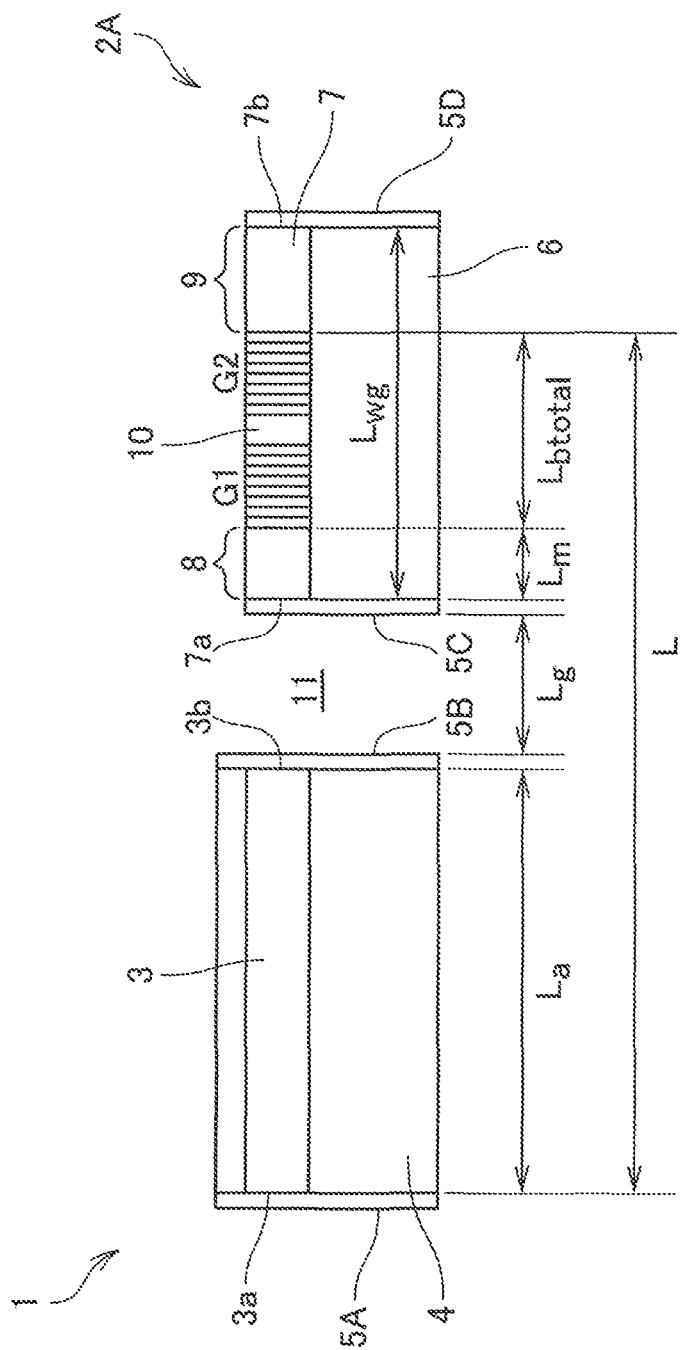
FIG. 2 is a view schematically showing another external resonator type light-emitting device.

The light-emitting device shown in FIG. 2 is mostly identical to the light-emitting device shown in FIG. 1. However, in a grating element 2A shown in FIG. 2, two Bragg gratings G1 and G2 are provided between the incident side propagating portion 8 and the emitting side propagating portion 9 of the optical waveguide 7, and an intermediate propagating portion 10 having no diffraction grating is provided between the Bragg gratings G1 and G2 adjacent to each other.

Figure 3:
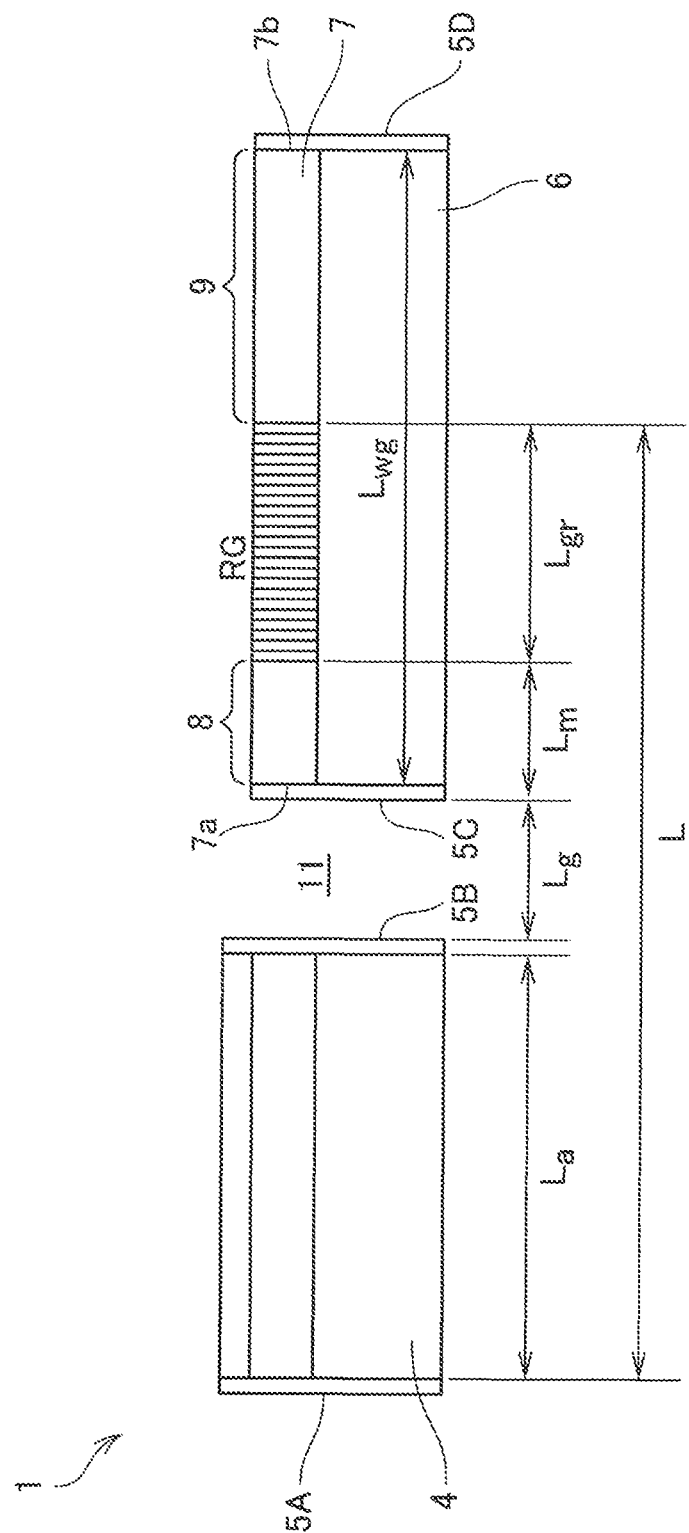
FIG. 3 is a view schematically showing an external resonator type light-emitting device as a contrasting example.

FIG. 3 is a view schematically showing a light-emitting device as a contrasting example. In the case of the grating element in the present device, an integrated Bragg grating 9 is provided between the incident side propagating portion 8 and the emitting side propagating portion 9 of an optical waveguide 7.

The operation of the device according to the present invention will be explained referring to FIG. 4.

Figure 4:
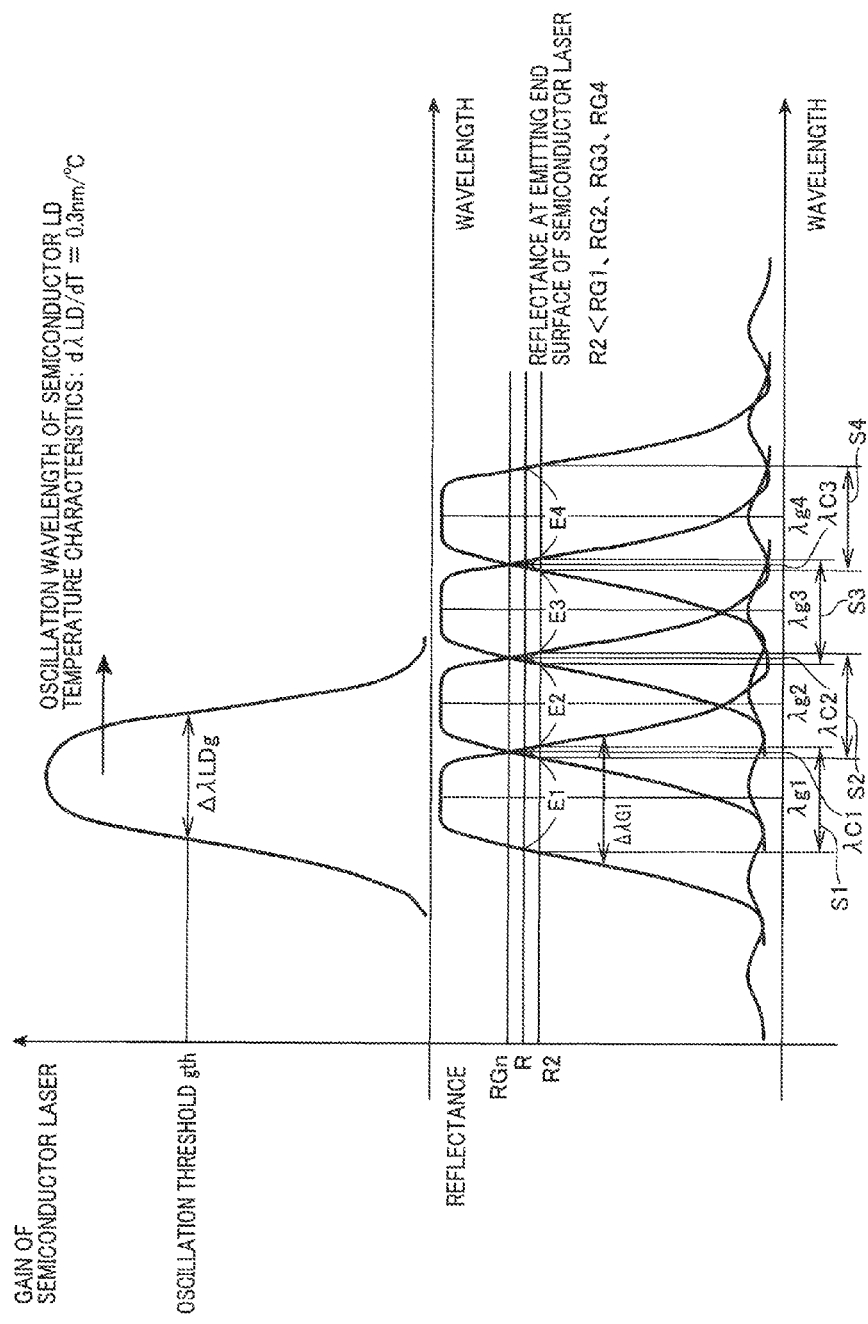
FIG. 4 is a wavelength characteristic diagram for illustrating the concept of the present invention.

The upper side of FIG. 4 shows the dependency of the gain of semiconductor laser light on wavelength, and the lower side of FIG. 4 shows wavelength characteristics of the reflectances of four Bragg gratings G1, G2, G3 and G4.

According to the present invention, a plurality of Bragg gratings each have a different pitch. As a result, the wavelength characteristics of reflectance at each Bragg grating become different from each other. Then, with respect to the respective Bragg gratings, the Bragg gratings have wavelength regions, which has a higher reflectance than that at the emitting end of the light source. The wavelength regions of the Bragg gratings having central wavelengths, respectively, which are adjacent to each, are continuous.

That is to say, as shown in FIG. 4, the oscillation threshold value of the light source is designated as gth, and the half value width of the gain is designated as $\Delta\lambda LDg$. On the other hand, the central wavelengths of reflectances of Bragg gratings G1, G2, G3 and G4 are designated as $\lambda g1$, $\lambda g2$, $\lambda g3$ and $\lambda g4$, respectively, and half value widths of reflectances of the Bragg gratings are designated as $\Delta\lambda G1$, $\Delta\lambda G2$, $\Delta\lambda G3$ and $\Delta\lambda G4$, respectively. Further, the reflectance at the emitting end of the light source is designated as R2.

Further, each of reflectances when reflectance graphs of the Bragg gratings adjacent to each other are crossed is designated as RGn. In other words, the reflectances of Bragg gratings with central wavelengths adjacent to each other correspond thereto at predetermined wavelengths of $\lambda C1$, $\lambda C2$ and $\lambda C3$, respectively. The reflectances in this case are designated as RG1, RG2 and RG3, respectively. At each of these predetermined wavelengths, the graphs of the reflectances of Bragg gratings adjacent to each other are intersected.

Herein, as to the Bragg grating G1, a wavelength region S1, where the Bragg grating has a larger reflectance than reflectance R2 at the emitting end of the light source, is present. As to the Bragg gratings G2, G3 and G4, wavelength regions S2, S3 and S4, each where the Bragg grating has a larger reflectance than the reflectance R2 at the emitting end of the light source, are similarly present. Then, the wavelength regions S1, S2, S3 and S4 of the Bragg gratings G1, G2, G3 and G4 having central wavelengths adjacent to each other are continuous toward the direction of the wavelength axis, and are connected to each other with no interruption.

In addition, in the present example, as to the wavelength regions adjacent to each other, the wavelength regions S1 and S2, the wavelength regions S2 and S3, and the wavelength regions S3 and S4 each are partly overlapped, but in this case as well, it can be said that the wavelength regions adjacent to each other are continuous in the direction of the wavelength axis.

In other words, graphs of reflectances of Bragg gratings having central wavelengths adjacent to each other are crossed at RGn, and RGn becomes larger than R2.

The oscillation wavelength of laser light is determined with the wavelength reflected by the grating. If light reflected by the grating and light reflected from the end face on the grating element side of the active layer exceed the gain threshold value of the laser, the oscillation condition is satisfied. Thus, the laser light that exhibits high wavelength stability can be obtained.

In order to achieve higher wavelength stability, a feedback amount from the grating may be increased, and from this viewpoint, reflectance of the grating is set to be larger than reflectance at the end face of the active layer. Consequently, the gain obtained by a resonator provided with the grating becomes larger than that of a resonator of an original semiconductor laser, and thus stable laser oscillation becomes possible with the resonator provided with the grating.

From this result, when the oscillation wavelength of the light source is shifted in response to temperature changes, oscillation of any of the Bragg gratings G1-G4 is secured even at the wavelength after having been shifted. As a result, stability of the laser oscillation with respect to the temperature changes is largely improved.

According to the present invention, RGn is larger than reflectance R2 at the output end of the light source. From this viewpoint, RGn/R2 is preferably 1.01 or more, and more preferably 1.05 or more. RGn/R2 is further preferably 1.2 or more in viewpoint of the fact that wavelength stability and power stability are improved.

The wavelength region, where the Bragg grating has larger reflectance than that at the emitting end of the light source, is preferably present in each of the Bragg gratings, the foregoing wavelength regions of the Bragg gratings having central wavelengths adjacent to each other are made continuous. In this case, a plurality of the wavelength regions become continuous, but the difference between the upper limit of the wavelength and the lower limit of the wavelength of the continuous wavelength regions is preferably 5 nm or more, and more preferably 10 nm or more.

Various studies concerning wavelength characteristics of reflectances of a plurality of Bragg gratings have been done by the present inventor. Such studies have not been sufficiently done in the external resonator type light-emitting devices each using a conventional grating element.

In cases where operations are carried out by connecting a plurality of Bragg gratings in series, the mode hopping interval becomes largely different because resonator lengths are significantly different from each other depending on each grating. For this reason, in the case of laser oscillation with a short resonator, mode hopping hardly occurs even upon temperature change, thereby resulting in a stable wavelength, but in the case of laser oscillation with a long resonator, mode hopping tends to occur because the mode hopping interval becomes narrow, and thus wavelength stability tends to be deteriorated.

In the process of the studies, as to each Bragg grating, attention has been focused on the fact that there are wavelength regions each where its reflectance is greater than that at the emitting face of the light source, and it has been conceived that the foregoing wavelength regions of Bragg gratings having central wavelengths adjacent to each other are made continuous.

In the wavelength regions each where the reflectance of the Bragg grating is greater than that at the emitting face of the light source, oscillation with the Bragg gratings is possible. Then, when the environmental temperature is changed, the wavelength of laser light oscillating from the light source is shifted. In this case, even though the wavelength of laser light oscillating from the light source is shifted, a Bragg grating, to which a central wavelength is adjacent, is functioned in response to shifting thereof, and thus an easy oscillation condition is obtained by making the wavelength regions of Bragg gratings having central wavelengths adjacent to each other to be continuous. From this result, temperature stability is further improved as a whole device.

According to a preferred embodiment, reflectances of Bragg gratings having central wavelengths adjacent to each other correspond thereto at the predetermined wavelengths of $\lambda C1$, $\lambda C2$, and $\lambda C3$, respectively (refer to FIG. 4), and a minimum value R of grating reflectance necessary for laser oscillation in an external resonator mode is not less than reflectance R2 at the emitting end of the light source and is not more than each of reflectances RG1, RG2 and RG3 of the Bragg gratings at the predetermined wavelengths of $\lambda C1$, $\lambda C2$ and $\lambda C3$, respectively. By this, stable oscillation is possible over the wide wavelength range.

Herein, wavelength widths (difference between the upper limit of wavelength and the lower limit of wavelength) of wavelength regions each where the reflectance of each Bragg grating is not less than a minimum value R of grating reflectance necessary for laser oscillation in an external resonator mode are designated as E1, E2, E3 and E4 (En), respectively.

From the viewpoint of expanding the temperature tolerance range of each Bragg grating, each wavelength range width En is preferably increased.

Figure 5:
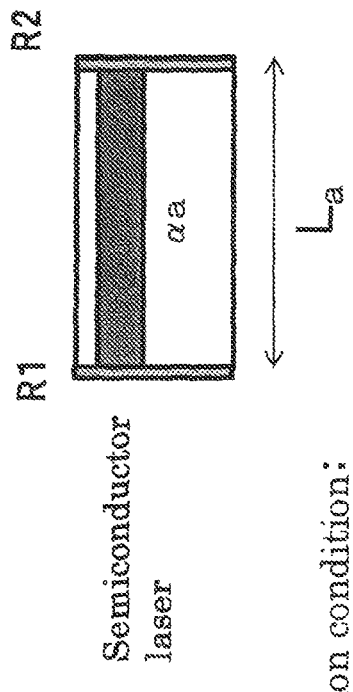
FIG. 5 is a view schematically showing a laser oscillation condition.

The minimum value R of grating reflectance necessary for laser oscillation in an external resonator mode is reflectance required for satisfying a gain threshold value of an external resonator formed by a semiconductor laser and gratings. The gain threshold value of the external resonator is determined by the after-mentioned mathematical formula (2-2). In comparison to the case of only the semiconductor laser shown in FIG. 5, a coupling efficiency of a semiconductor laser and a grating element, and any loss of a grating element unit or the like each becomes a factor that decreases the gain. For this reason, the lowest reflectance R for laser oscillation in the external resonator mode is conventionally set to be larger than reflectance R2 at the emitting end of the semiconductor laser. However, in cases where the coupling efficiency is 100% with no loss, R=R2 is obtained.

En can be determined in accordance with the gain curve of a semiconductor laser light source.

That is to say, preferably set is $(1/10) \times \Delta\lambda LDg \leq En \leq \Delta\lambda LDg$, and more preferably set is $(1/5) \times \Delta\lambda LDg \leq En \leq (3/4) \times \Delta\lambda LDg$.

Figure 6:
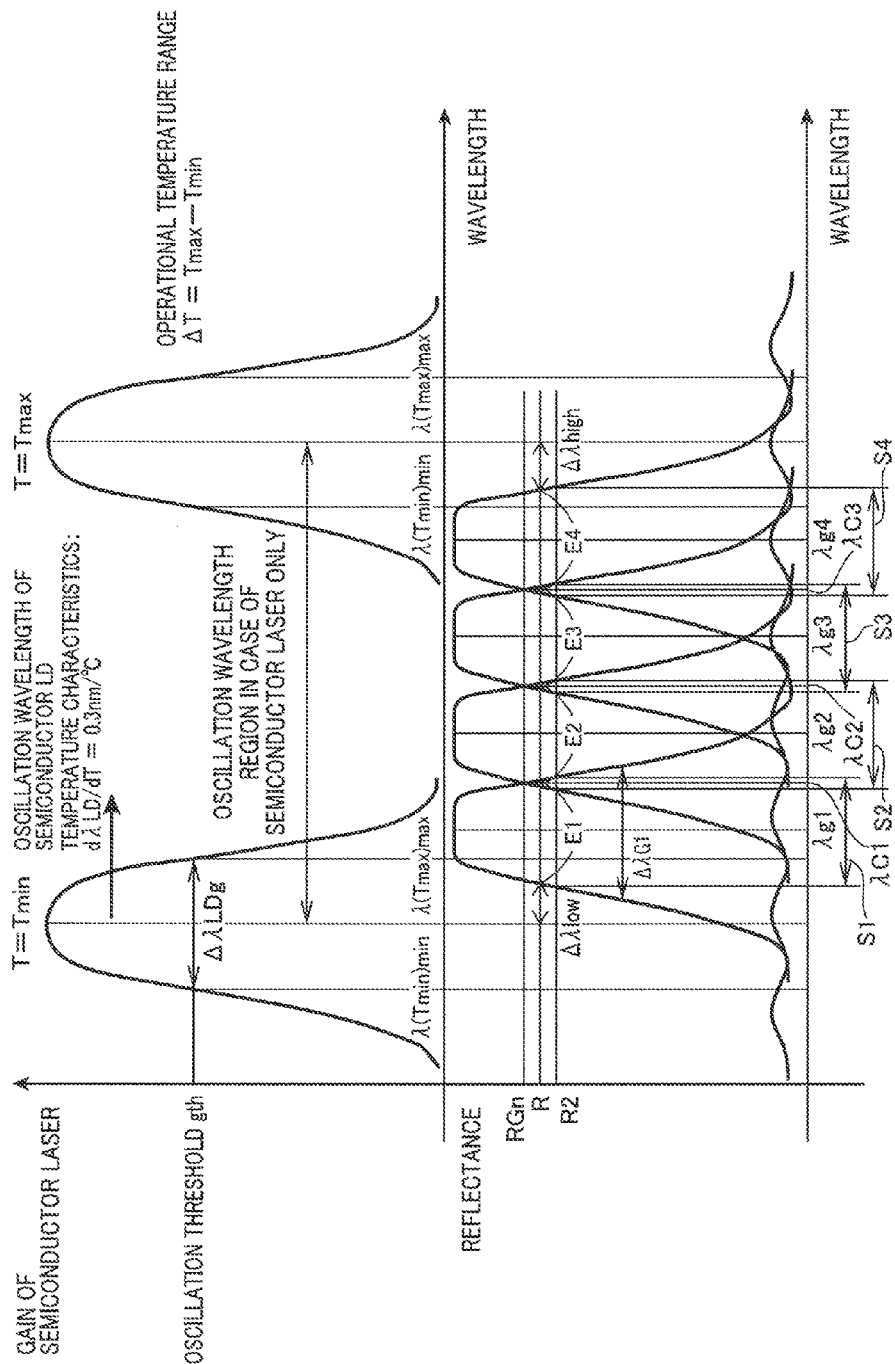
FIG. 6 is a wavelength characteristic diagram for illustrating the concept of the present invention.

However, $\Delta\lambda LDg$ represents a wavelength width (difference between the maximum wavelength and the minimum wavelength) of the gain curve when the gain of a semiconductor laser is an oscillation threshold value gth (refer to FIG. 6).

Further, as a specific example, preferable is $\Delta\lambda Gn \geq 2$ nm. $\Delta\lambda Gn$ is preferably 6 nm or less, and more preferably 5 nm or less, because when $\lambda Gn$ is excessively greater than LD, mode hopping is easily produced, and wavelength stability becomes deteriorated, resulting in large fluctuations in power.

Further, according to a preferred embodiment, the reflection central wavelength interval of each grating is preferably set as described below.

$$\lambda g(n+1) - \lambda g(n) \leq \{\Delta\lambda G(n+1) + \Delta\lambda Gn\} \times \frac{1}{2}$$

Further, it is preferable to be done as described below.

$$\lambda g(n+1) - \lambda g(n) \leq \{E(n+1) + En\} \times \frac{1}{2}$$

$\{\lambda g(n+1) - \lambda g(n)\}$ represents a central wavelength interval between grating elements Gn and G(n+1) adjacent to each other.

$\{\Delta\lambda G(n+1) + \Delta\lambda Gn\}$ represents the sum of a half value width of the Bragg grating reflectance of the grating element Gn and a half value width of the reflectance of the grating element G(n+1), the grating elements Gn and G(n+1) adjacent to each other.

$\{E(n+1) + En\}$ represents the total value of En of the neighboring Bragg grating Gn and E(n+1) of the Bragg grating element G(n+1).

Further, from the viewpoint of securing the wavelength stability of the device and the power stability thereof, the following are preferable.

$$\lambda g(n+1) - \lambda g(n) \geq \{E(n+1) + En\} \times \frac{1}{4}$$

Further, it is preferable to be done as described below.

$$\lambda g(n+1) - \lambda g(n) \geq \{\Delta\lambda G(n+1) + \Delta\lambda Gn\} \times \frac{1}{4}$$

It is preferable to adjust the grating pitch so as to meet such a condition.

In order to suppress mode hopping and to secure temperature stability of the device, there is a need for the mode hopping to have an increased interval by shortening the resonator length. From this viewpoint, a distance L (refer to FIGS. 1 and 2) from an outside reflection end of a semiconductor laser to an emitting side end point of a plurality of Bragg gratings is preferably 1 mm or less, and further, from the viewpoint of increasing the longitudinal mode interval of an external resonator to suppress mode hopping, L is preferably 700 µm or less, and most preferably 500 µm or less.

In order to satisfy the above-described relationship, a length $L_{btotal}$ from a start point to an end point of the Bragg grating is preferably 500 µm or less, more preferably 300 µm or less, and most preferably 100 µm or less. Further, in order to obtain a feedback rate of light necessary for laser oscillation, $L_{btotal}$ is preferably 10 µm or more, and more preferably 20 µm or more.

From the viewpoint of shortening the resonator length, the lengths of Bragg gratings each are preferably 200 µm or less. Further, the longer the grating length is, the smaller the $\Delta\lambda Gn$ becomes, and thus in order to increase this, the length of each Bragg grating is preferably 100 µm or less. Further, in order to obtain a feedback rate of light necessary for laser oscillation, $\Delta\lambda Gn$ is preferably 10 µm or more.

In order to shorten the length of a grating element, and to make the reflectance to be larger than reflectance at the emitting end of the semiconductor laser, it is preferable to increase difference between a refractive index nb of an optical waveguide forming gratings, and the refractive index nc of a clad part. Thus, nb is preferably 1.7 or more, and more preferably 1.8 or more.

Further, in order to make the grating reflectance to be larger than that at the emitting end face of a semiconductor laser, the grating depth td (refer to FIG. 11) is preferably 20 nm or more. Further, the grating depth td is preferably 250 nm or less, and more preferably 200 nm or less.

From the viewpoint of improving the coupling efficiency of a semiconductor laser, an optical waveguide preferably has a height (thickness) Ts (refer to FIGS. 7-9) of 0.5 µm or more and 3.0 µm or less.

From the viewpoint of a single mode waveguide, an optical waveguide of Bragg gratings preferably has a width Wgr (refer to FIG. 10) of 0.5 µm or more and 4 µm or less.

According to a preferred embodiment, a distance Lg between the emitting face of the light source and the incident face of the optical waveguide may be 0, but is set to be 1 µm or more and 10 µm or less from the viewpoint of relaxing a stress caused by thermal expansion depending on temperature change of each element. The stable oscillation becomes possible with this. Further, the length Lm of the incident side propagation portion may be 0, but is preferably 1-100 µm, and more preferably 5-20 µm.

The active layer in the light source preferably has a length La of 500 µm or less.

Further, $La + Lg + Lm + L_{btotal}$ is preferably 1050 µm or less, and more preferably 800 µm or less. Further, $La + Lg + Lm + L_{btotal}$ is preferably 300 µm or more.

The act of the present invention will hereinafter be described further.

For example, the temperature characteristic of a GaAs semiconductor laser exhibits 0.3 nm/° C., and when the temperature increases by 10° C., the oscillation wavelength is shifted to the long wavelength side by 3 nm. $\Delta\lambda LDg$ is different depending on semiconductor lasers, but is generally a value ranging from approximately 4 nm to 10 nm.

The temperature operation range can be obtained by dividing the difference of central wavelengths of the gain of a semiconductor laser between at Tmin and at Tmax by temperature characteristics. This wavelength difference is one obtained by adding the sum $\{\Sigma(En)\}$ of wavelength regions En, and $\Delta\lambda$low and $\Delta\lambda$high to the short wavelength side and long wavelength side of this wavelength regions, respectively. In this case, the temperature operation range is represented by:

$$\Delta T = \{\Sigma(En) + \Delta\lambda \text{low} + \Delta\lambda \text{high}\}/0.3 \text{ nm}/° \text{C}.$$

where the temperature shift of the reflection wavelength of a grating element is 0 nm/° C. In the case of a conventional laser, $\Delta\lambda$low and $\Delta\lambda$high each are numerical values ranging from 2 nm to 3 nm (refer to FIG. 6).

For example, as described in FIG. 6, in cases where four gratings are connected in series, the operation temperature range is from approximately 66° C. to approximately 73° C. when each En is set to 4 nm.

Further, when the temperature shift of the reflection wavelength of a grating element is 0.1 nm/° C., obtained is: $\Delta T = \{\Sigma(En) + \Delta\lambda \text{low} + \Delta\lambda \text{high}\}/(0.3 - 0.1)$ nm/° C., and in the case of FIG. 6, the operation temperature range is from 100° C. to 110° C.

In FIG. 6, reflectance graphs of grating elements are crossed at reflectances RGn, respectively. In this case, as to wavelength ranges S1-S4 at a reflectance of R2, each two adjacent grating elements have an overlapped region.

According to a preferred embodiment, the optical waveguide 7 is a ridge type optical waveguide, and is provided in an optical material layer. In this case, the optical waveguide 7 may be formed on the same surface as that of the Bragg grating, or may be formed on a surface facing the Bragg grating.

The reflectances of the antireflection layers 5B, 5C and 5D each may be a value smaller than grating reflectance, and is more preferably 0.1% or less. However, if the reflectance at the end face is a value smaller than that of the grating reflectance, an antireflection layer may not be provided, but a reflection film may be provided. When a reflection film is formed instead of providing an antireflection layer on the end face on the grating element side of the active layer, this turns out to be a configuration of a conventional semiconductor laser. In this case, the light source 1 becomes one which singly executes the laser oscillation by itself alone.

Figure 7A:
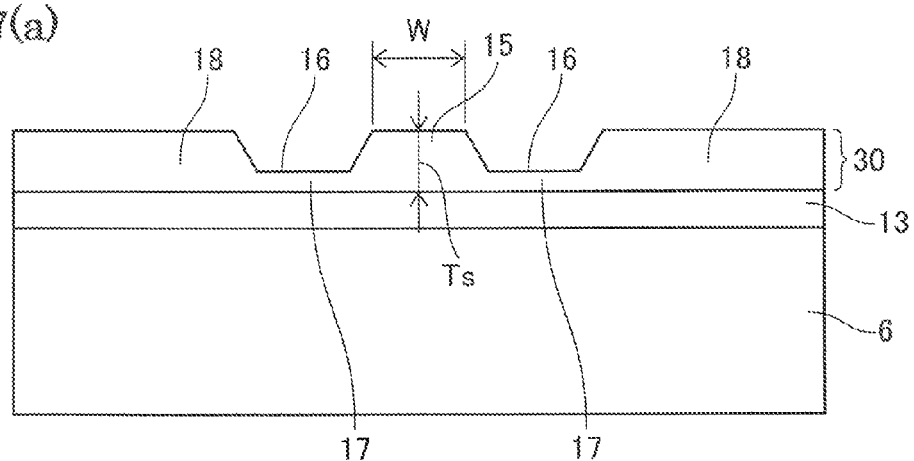
FIGS. 7(a), 7(b) and 7(c) each are a view schematically showing a cross section of a grating element including a ridge type optical waveguide.

According to a preferred embodiment, as shown in FIG. 7(a), the optical material layer 30 is formed on a substrate 6 via a lower side buffer layer 13. For example, a pair of ridge grooves 16 are formed in the optical material layer 30, and a ridge type optical waveguide 15 is formed between the ridge grooves. In this case, the Bragg grating may be formed on a flat surface, or may be formed on a ridge groove surface. From the viewpoint of reducing the variation in shapes of the Bragg grating and ridge groove, it is preferable to provide the Bragg grating and the ridge groove on the opposite sides of the optical material layer 30 by forming the Bragg grating on the flat surface. Numeral 17 represents a thin part, and Numeral 18 represents an extension part. In addition, an adhesive layer may be also provided between the buffer layer 13 and the supporting substrate 6.

As shown in FIG. 7(a), in cases where no upper side buffer layer is provided, an air layer thereof can come in direct contact with the grating. Thus, the diffractive index difference can be increased via the presence and absence of the grating groove, and reflectance can be increased with a short grating length.

Figure 7B:
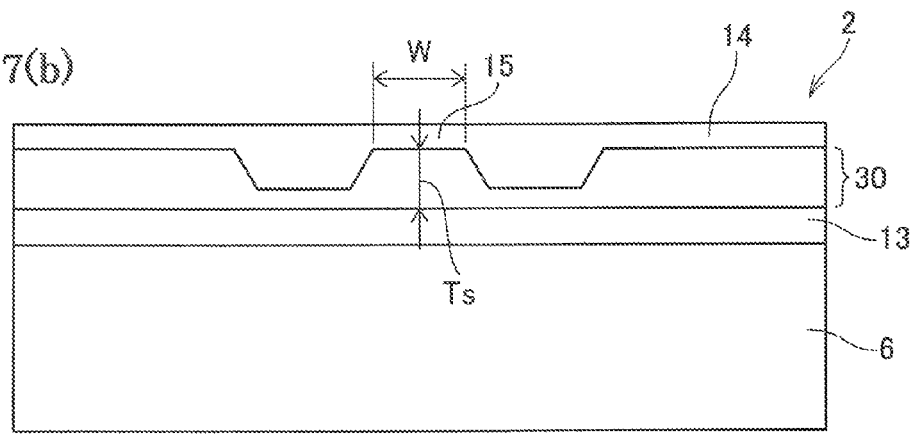

Further, in the case of the element shown in FIG. 7(b), an upper side buffer layer 14 is further formed on the optical material layer 30.

Figure 7C:
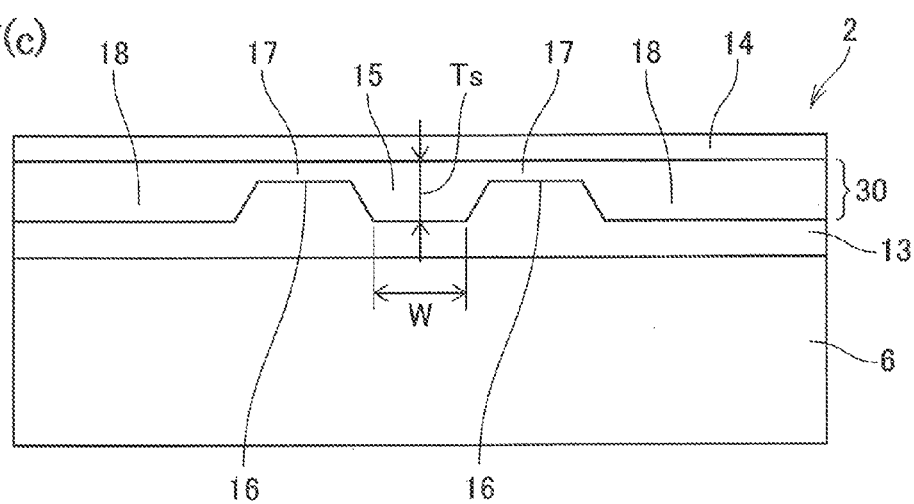

Further, as shown in FIG. 7(c), the optical material layer 30 is formed on the substrate 6 via the lower side buffer layer 13. For example, a pair of ridge grooves 16 are formed in the optical material layer 30, and a ridge type optical waveguide 15 is formed between the ridge grooves. In the present example, the ridge groove is provided on the buffer layer 13 side. In this case, the Bragg grating may be formed on a flat surface, or may be formed on a ridge groove surface. From the viewpoint of reducing the variation in shapes of the Bragg grating and ridge groove, it is preferable to provide the Bragg grating and the ridge groove on the opposite sides of the substrate by forming the Bragg grating on the flat surface. Numeral 17 represents a thin part, and Numeral 18 represents an extension part. In addition, an adhesive layer may be also provided between the buffer layer 13 and the supporting substrate 6.

According to a preferred embodiment, the optical waveguide is composed of a core made of an optical material, and a clad surrounds the circumference of the core. The cross section (the cross section in the direction perpendicular to the propagation direction of light) shape of this core is arranged to be a convex figure.

The convex figure means that line segments connecting two arbitrary points on an outside contour line of the cross section of a core are positioned inside the outside contour line of the cross section of the core. The convex figure is a general term in geometry. Examples which can be exemplified as such a figure include polygon such as triangle, tetragon, hexagon, octagon or the like, circle, ellipse, and so forth. Specifically, the tetragon possessing an upper side, a lower side, and a pair of side faces is preferable as a tetragon, and a trapezoid is specifically preferable.

Figure 8A:
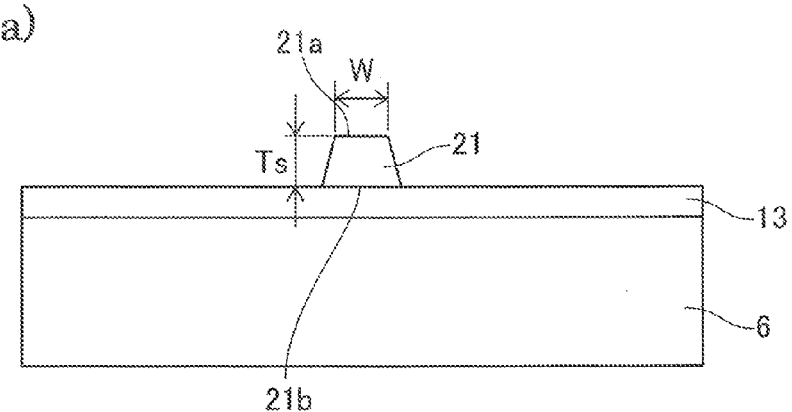
FIGS. 8(a), 8(b) and 8(c) each are a view schematically showing a cross section of a grating element including an optical waveguide whose cross section is a trapezoid.

For example, as shown in FIG. 8(a), an optical waveguide 21 includes a core made of an optical material is formed on a substrate 6 via the lower side buffer layer 13. The lower side buffer layer 13 that functions as a clad is present on the lower side of this optical waveguide 21. No upper side buffer layer is provided on the side face and the upper surface of the optical waveguide 21. For this reason, the side face and the upper surface of the optical waveguide 21 are exposed to the atmosphere, and thus the atmosphere functions as a clad. The cross sectional shape of the optical wavelength 21 is a trapezoid, and an upper face 21a is narrower than a lower face 21b. In addition, an adhesive layer can be also formed between the buffer layer 13 and the supporting substrate 6.

Figure 8B:
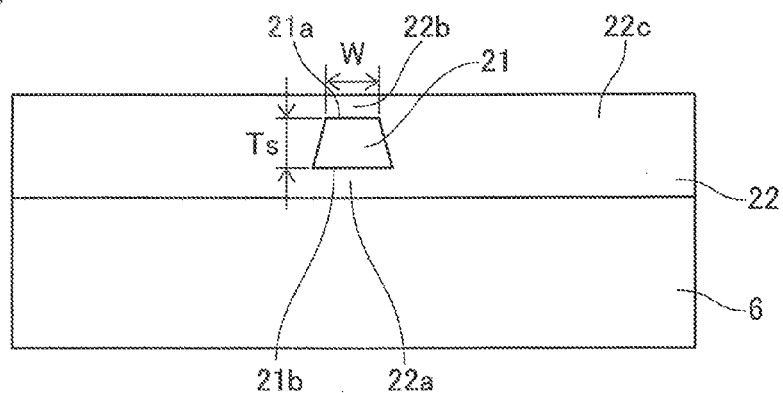

According to an element shown in FIG. 8(b), a buffer layer 22 is formed on the substrate 6, and the optical waveguide 21 includes a core made of an optical material is embedded inside the buffer layer 22. The buffer layer 22 includes an upper face covering part 22b covering the upper face of the optical waveguide, a side face covering part 22c covering the side faces of the optical waveguide, and a bottom face covering part 22a covering the bottom face of the optical waveguide.

Figure 8C:
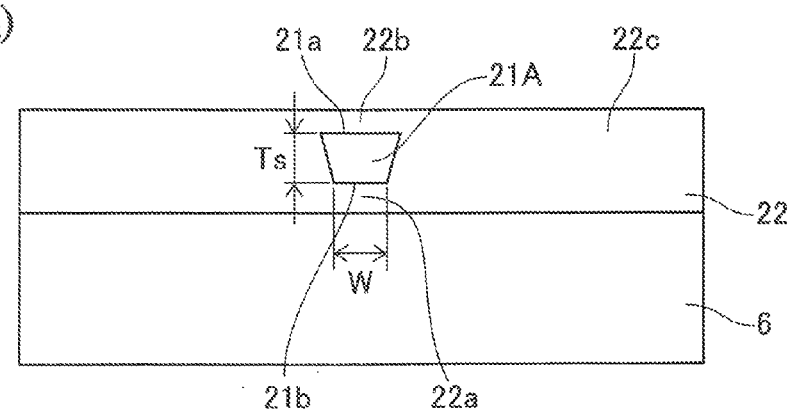

According to an element shown in FIG. 8(c), a buffer layer 22 is formed on the substrate 6, and an optical waveguide 21A includes a core made of an optical material is embedded inside the buffer layer 22. The buffer layer 22 includes an upper face covering part 22b covering the upper face of the optical waveguide, a side face covering part 22c covering the side faces of the optical waveguide, and a bottom face covering part 22a covering the bottom face of the optical waveguide.

Figure 9A:
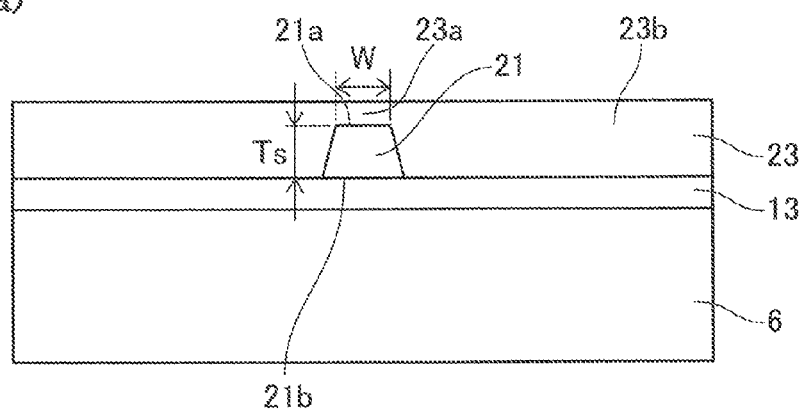
FIGS. 9(a) and 9(b) each are a view schematically showing a cross section of a grating element including an optical waveguide whose cross section is a trapezoid.

Further, according to an element shown in FIG. 9(a), an optical waveguide 21 composed of a core made of an optical material is formed on a substrate 6 via a lower side buffer layer 13. An upper side buffer layer 23 also functions as a clad is formed on side faces and an upper face 21a of the optical waveguide 21 to cover the optical waveguide 21. An upper side buffer layer 23 includes a side face covering part 23b covering the side faces of the optical waveguide 21 and an upper face covering part 23a covering the upper face of the optical waveguide.

Figure 9B:
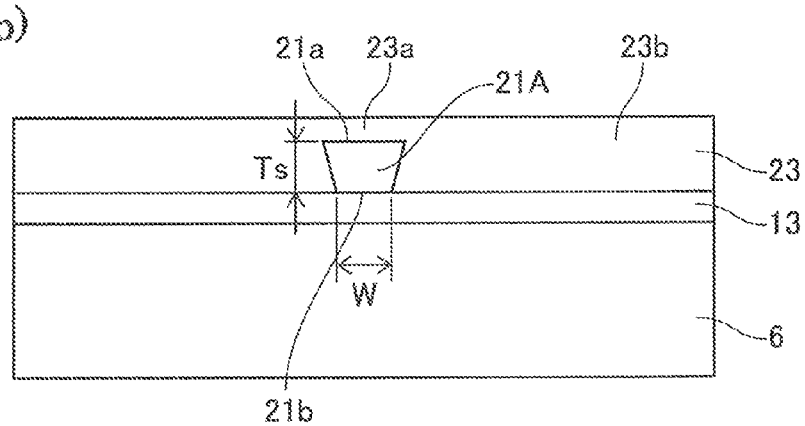

Further, according to an element shown in FIG. 9(b), an optical waveguide 21A composed of a core made of an optical material is formed. The cross sectional shape of the optical waveguide 21A is a trapezoid, and the lower face is narrower than the upper face. An upper side clad layer 23 includes a side face covering part 23b covering the side faces of the optical waveguide 21A and an upper face covering part 23a covering the upper face of the optical waveguide.

In addition, a width W of the optical waveguide means a minimum value of the width of the optical waveguide on a cross section thereof. In cases where the optical waveguide has a trapezoid in shape, whose upper face is narrow, the width W of the optical waveguide is a width of the upper face, and in cases where the optical waveguide has a trapezoid in shape, whose lower face is narrow, the width W of the optical waveguide is a width of the lower face. In addition, symbol W means an inclusive concept of Win, Wout and Wgr.

According to a preferred embodiment, as shown in FIGS. 1 and 2, an incident side propagation portion is provided between the incident face 7a of the optical waveguide 7 and the start point of Bragg gratings, and further, an emitting side propagation portion is provided between the end point of the Bragg gratings and the emitting face.

Figure 10A:
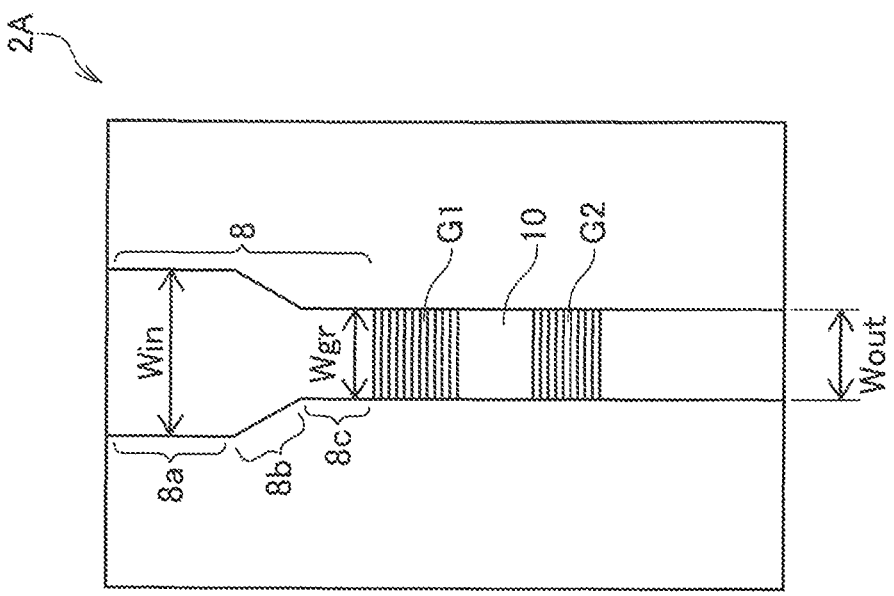
FIGS. 10(a) and 10(b) each are a view schematically showing a planar form of a grating element according to the present invention.
Figure 10B:
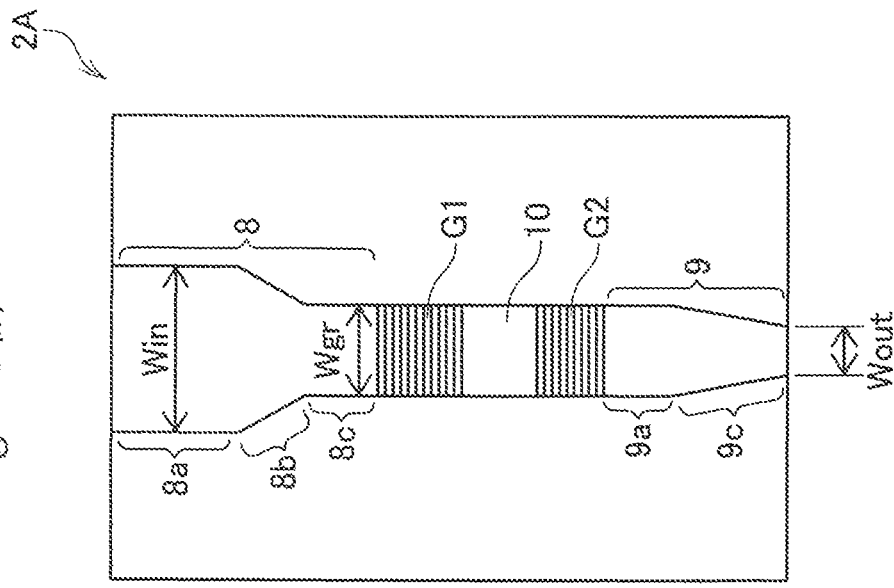

According to a preferred embodiment, as shown in for example, FIGS. 10(a) and 10(b), the incident side propagation portion 8 includes an incident portion 8a continuous from the incident face, a narrow width portion 8c leading to the Bragg gratings, and a tapered portion 8b gradually changing in optical waveguide width. The width Win of the incident portion 8a is set to be larger than the width Wgr of the narrow width portion 8c.

Further, the optical waveguide width Wout in the emitting side propagation portion has become identical to Wgr according to the example shown in FIG. 10(a). However, Wout may be larger than Wgr, and may be smaller than Wgr. According to the example shown in FIG. 10(b), the emitting side propagation portion 9 includes a connection portion 9a continuous from the Bragg gratings, and a tapered portion 9c directed toward an emitting end portion. The optical waveguide width in the tapered portion 9c becomes gradually reduced toward the optical waveguide width Wout at the emitting end portion.

Figure 11:
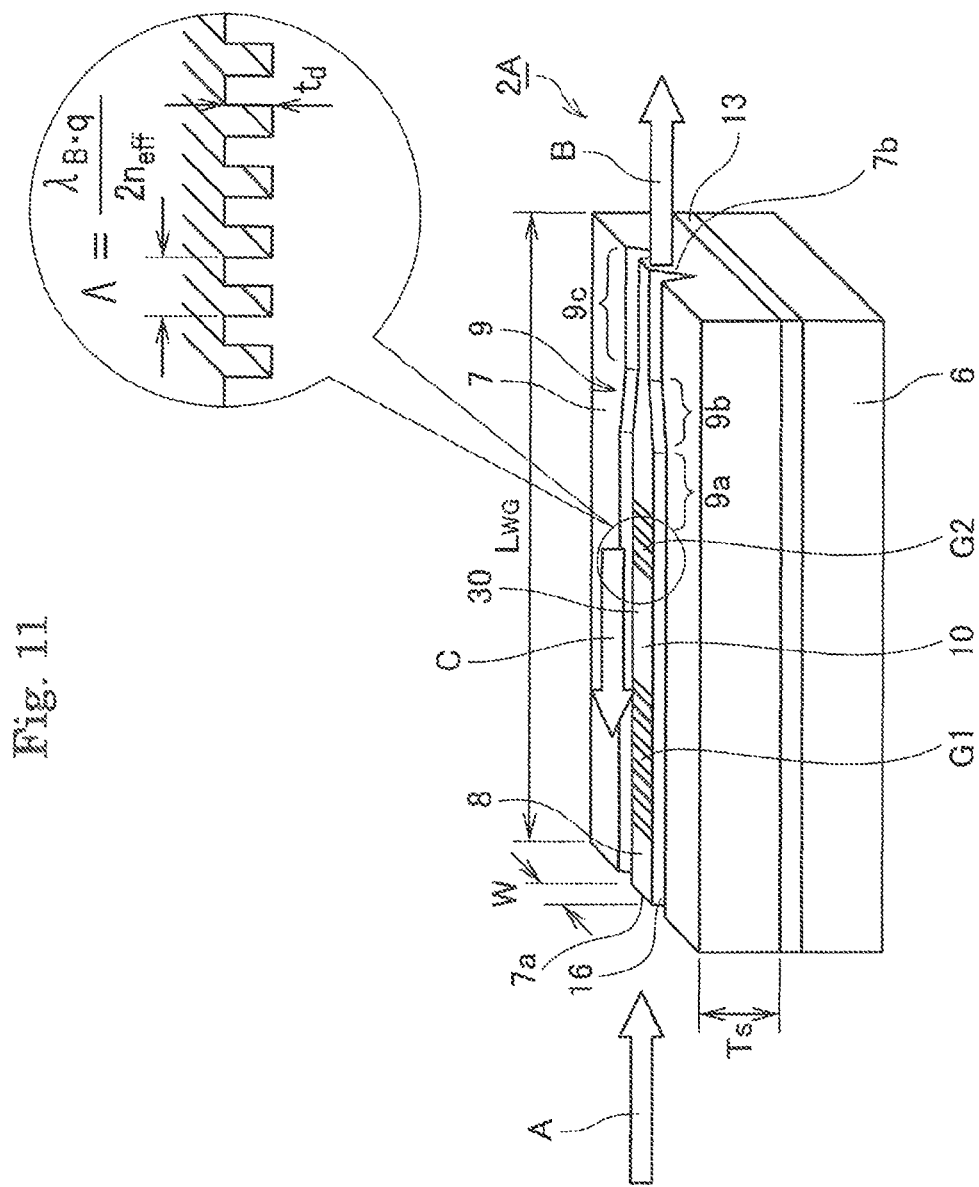
FIG. 11 is a perspective view schematically showing a grating element.

According to an example shown in the perspective view of FIG. 11, the emitting side propagation portion 9 includes a connection portion 9a continuous from the Bragg gratings, an emitting portion 9c connected to the emitting end portion, and a tapered portion 9b provided between the connection portion 9a and the emitting portion 9c. The optical waveguide width in the tapered portion 9b becomes gradually reduced toward the optical waveguide width Wout at the emitting end portion.

In addition, according to the present example, the optical waveguide width Wgr in the connection portion 9a is constant, and the optical waveguide width Wout in the emitting portion 9c is also constant.

In addition, symbol A represents light incident on the grating element; symbol B represents light emitting from the grating element; and symbol C represents grating reflection light.

A laser obtained from a GaAs material system or an InP material system exhibiting high reliability is preferable as a light source. As a structure application case according to the present application, for example, in the case of executing the second harmonic green laser oscillation by using a nonlinear optical element, a GaAs system laser oscillating at a wavelength of approximately 1064 nm is to be used. A GaAs system laser and an InP system laser each exhibits high reliability, and thus light sources such as a laser array arranged in the one-dimensional state and so forth are also possible to be realized. A superluminescent diode and a semiconductor optical amplifier (SOA) may be also accepted. Further, the material and wavelength of an active layer can be appropriately selected.

In addition, a method for stabilizing power by using a semiconductor laser and a grating element in combination has been disclosed as described below.
(Non-patent document 3: Furukawa Review No. 105, pp. 24-29, January 2000)

An optical waveguide is obtained by physically performing a processing via for example, cutting processing with a peripheral cutting edge, or laser ablation processing, followed by molding.

The Bragg gratings may be formed by carrying out physical or chemical etching as described below.

As a specific example, a metal film such as Ni, Ti or the like is film-formed a high refractive index substrate, and windows are periodically formed by photolithography to form a mask for etching. Periodical grating grooves are subsequently formed by a dry etching apparatus for reactive ion etching and so forth. Lastly, the metal mask is removed therefrom to form them.

In order to further improve an optical damage-resistance property of an optical waveguide, at least one metal element selected from the group consisting of magnesium (Mg), zinc (Zn), scandium (Sc) and indium (In) may be contained in the optical waveguide, and in this case, magnesium is specifically preferable. Further, a rare earth element may be contained in a crystal as a doping component. Specifically preferable examples of the rare earth include Nd, Er, Tm, Ho, Dy and Pr.

The material for an adhesive layer may be an inorganic adhesive; may be an organic adhesive; or may be one prepared by using the inorganic adhesive and the organic adhesive in combination.

Further, an optical material layer 30 may be film-formed on a supporting substrate by a film-forming method to form the optical material layer. Examples of such a film-forming method which can be exemplified include sputtering, vapor evaporation and CVD. In this case, the optical material layer 30 is formed directly on the supporting substrate, and thus no adhesive layer described above is present.

The specific material of the supporting substrate is not particularly limited thereto, and examples thereof include lithium niobate, lithium tantalate, glass and quartz such as quartz glass and so forth, Si, and so forth.

The reflectance of an antireflection layer should be not more than the grating reflectance, and a film laminated with an oxide such as silicon dioxide, tantalum pentoxide, magnesium fluoride, calcium fluoride or the like, and metals are usable as a film material to be formed on the antireflection film.

Further, each end face of the light source element and grating element may be cut at a slant to suppress the reflection at each end face. Further, joining the grating element to the supporting substrate may be adhesion fixing, or may be direct bonding.

Figure 12:
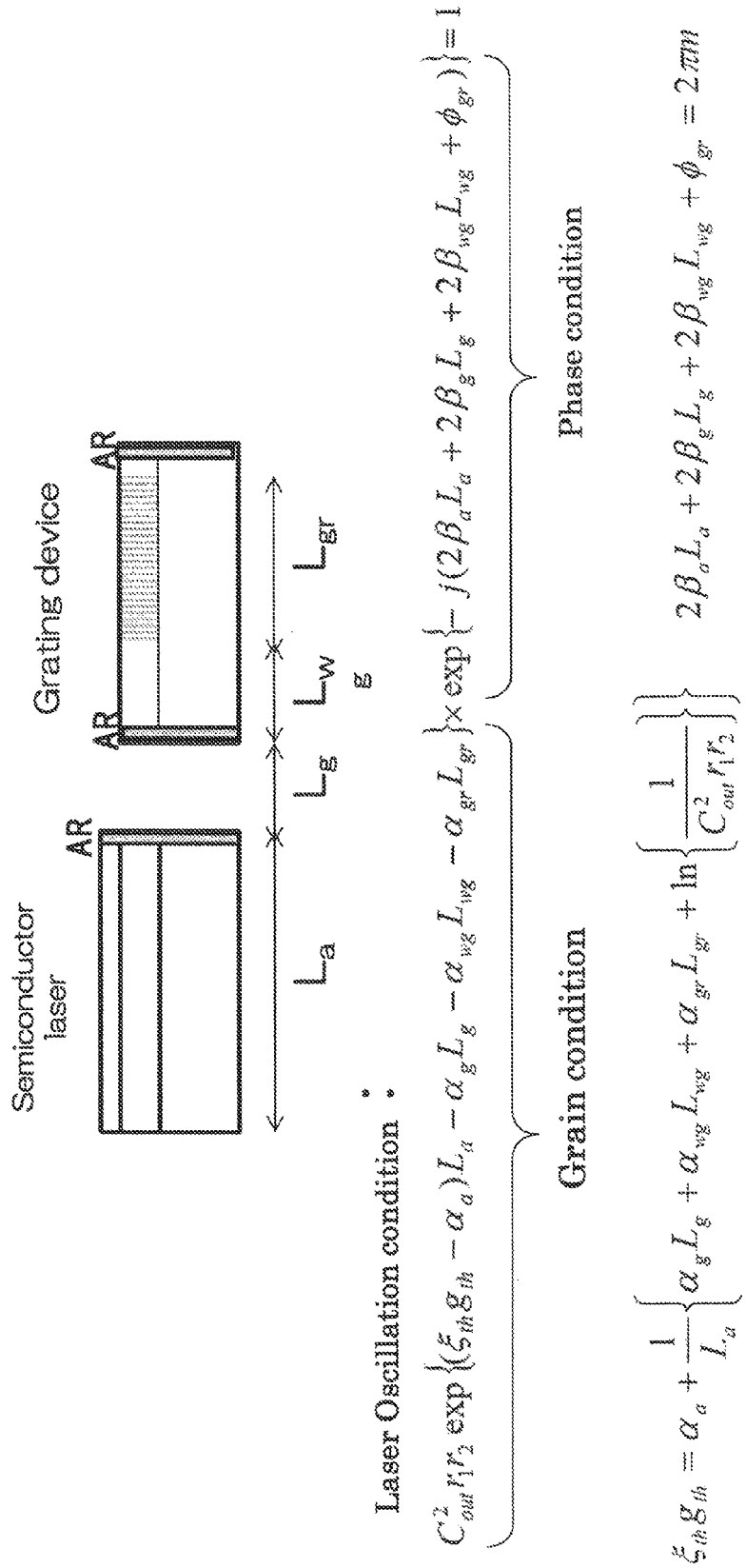
FIG. 12 is a diagram for illustrating a laser oscillation condition.

Next, as to the configuration as shown in FIG. 12, the meaning of the condition of the present embodiment will be further described.

However, since the mathematical formulae are abstract and difficult to be understood, atypical embodiment of conventional technology and the present embodiment will be directly compared with each other to firstly describe the features of the present embodiment. About individual conditions for this embodiment, a description will next be made one by one.

First, the oscillation condition of a semiconductor laser is determined by multiplying the gain condition by the phase condition as shown in the following formula.

$$(C_{out}^2)^4 |r_1||r_2| \exp\{(\zeta_t g_{th} - \alpha_a)L_a - \alpha_b L_b\} \times \exp\{j(-\phi_1 - \phi_2 - 2\beta L_a)\} = 1 \quad \text{Formula (2-1)}$$

The gain condition is expressed as the following formula from the formula (2-1).

$$\zeta_t g_{th} = \alpha_a L_a + \alpha_b L_b + \frac{1}{L_a} \ln\left(\frac{1}{|r_1||r_2|C_{out}^2}\right) \quad \text{Formula (2-2)}$$

Herein, αa, αg, αwg and αgr represent loss coefficients of an active layer, a gap between a semiconductor laser and a waveguide, a grating-unprocessed waveguide portion on the input side, and a grating portion, respectively; La, Lg, Lwg and Lgr represent lengths of the active layer, the gap between the semiconductor laser and the waveguide, the grating-unprocessed waveguide portion on the input side, and the grating portion, respectively; r1 and r2 each represent mirror reflectances (r2 represents grating reflectance); Cout represents coupling loss between a grating element and a light source; $\zeta_i g_{th}$ represents a gain threshold value of a laser medium; ϕ1 represents a phase change amount produced by a reflection mirror on the laser side; and ϕ2 represents a phase change amount at the grating portion.

The formula (2-2) indicates occurrence of laser oscillation in cases where the gain $\zeta_i g_{th}$ (gain threshold value) of the laser medium exceeds the loss. The gain curve (wavelength dependent) of the laser medium has a full width at half maximum of 50 nm or more, and exhibits broad characteristics. Further, the loss portion (right side) hardly depends on wavelength except the grating reflectance, and thus the gain condition is determined by the grating. For this reason, according to the comparison table, the gain condition can be taken into consideration only by the grating.

On the other hand, the phase condition is expressed as the following formula from the formula (2-1). However, ϕ1 becomes zero.

$$\phi_2 + 2\beta L_a = 2p\pi \qquad \text{Formula (2-3)}$$

(p represents an integer)

The length $L_{btotal}$ of the Bragg grating has been given as described previously. It is based on the premise of design concept according to the present embodiment that the length $L_{btotal}$ of the Bragg grating is set to be shorter than conventional one. That is to say, in order to make it difficult to occur mode hopping, the wavelength interval (longitudinal mode interval) meeting the phase condition should be set to be larger. For this reason, the resonator length should be shortened, and the grating element length is shortened.

To shorten the grating element length means to reduce the loss, and thus the laser oscillation threshold value can be reduced. From this result, operations are possible at low electric current, low heat generation and low energy.

Further, the grating length $L_{btotal}$ is preferably 5 μm or more in order to obtain a reflectance of 3% or more, and is more preferably 10 μm or more in order to obtain a reflectance of 5% or more.

According to a preferred embodiment, in order to accelerate laser oscillation, the grating element is set to preferably have a reflectance of 3% or more and 40% or less. This reflectance is further preferably 5% or more in order to make output power to be more stable, and is further preferably 25% or less in order to increase the output power.

EXAMPLES

Example 1

Figure 13:
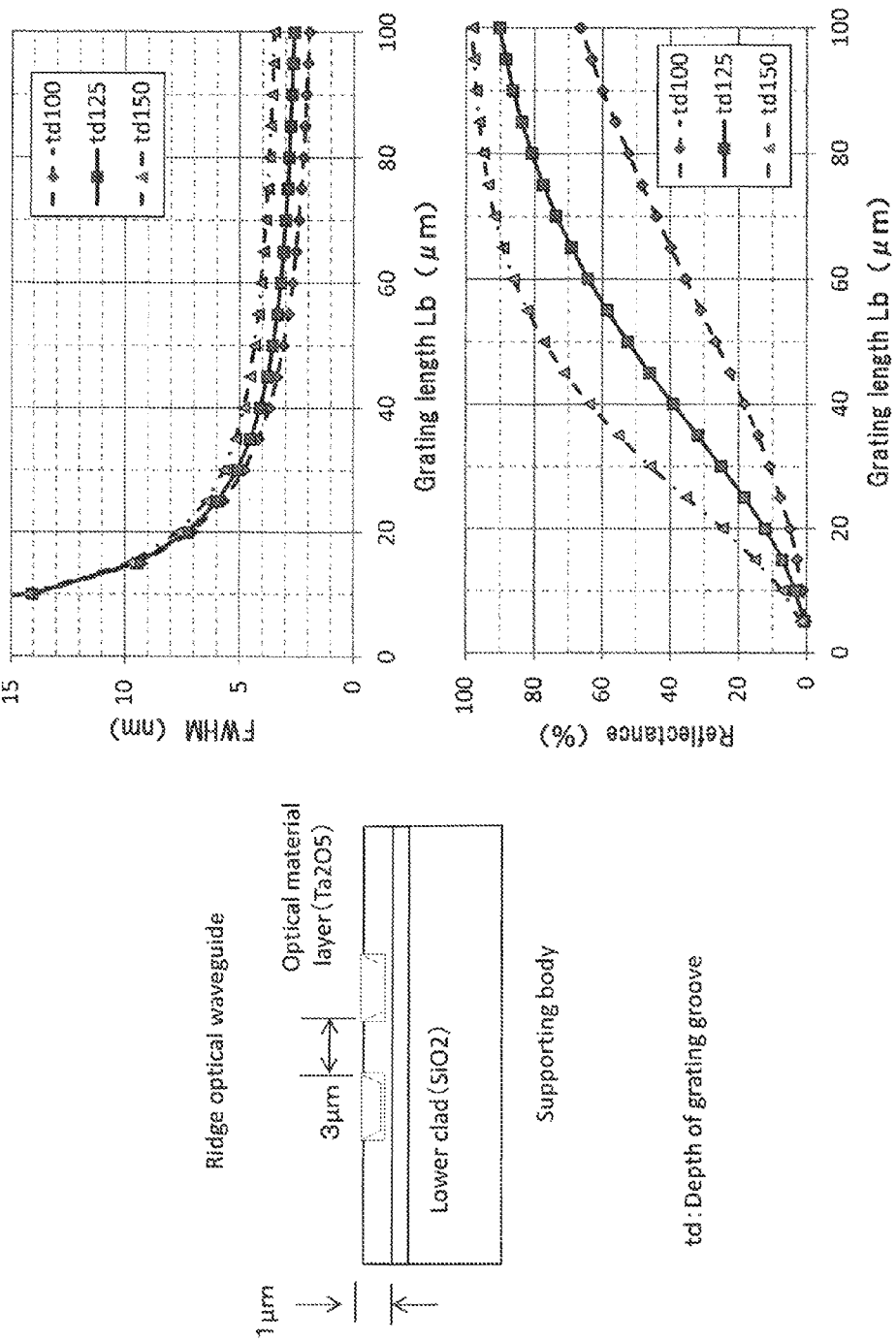
FIG. 13 shows calculated values of the grating reflectance and the half value width of reflection characteristics with respect to the grating length according to the structure concerning FIG. 2 and FIG. 7(b) in Example 1.

FIG. 13 shows calculated values of grating reflectances and half value widths of the reflection characteristic with respect to the grating length according to the structures shown in FIGS. 2 and 7(b). Grating groove depths td were set at 100 nm, 125 nm and 150 nm, respectively.

Ta2O5 was used to form the optical material layer, quartz was used to form the supporting substrate, and SiO2 was used to form the upper side clad layer and lower side clad layer.

As to the waveguide structure, the optical material layer has a thickness of 1 μm; the ridge waveguide has a width (upper most end) of 3 μm; and the ridge groove has a depth of 0.6 μm. The wavelength was set at 850 nm.

As a result, for example, in the case of a grating length of 25 μm at a grating depth td of 125 nm, characteristics of a reflectance of 18% and a half value width of 6 nm can be obtained.

Figure 14:
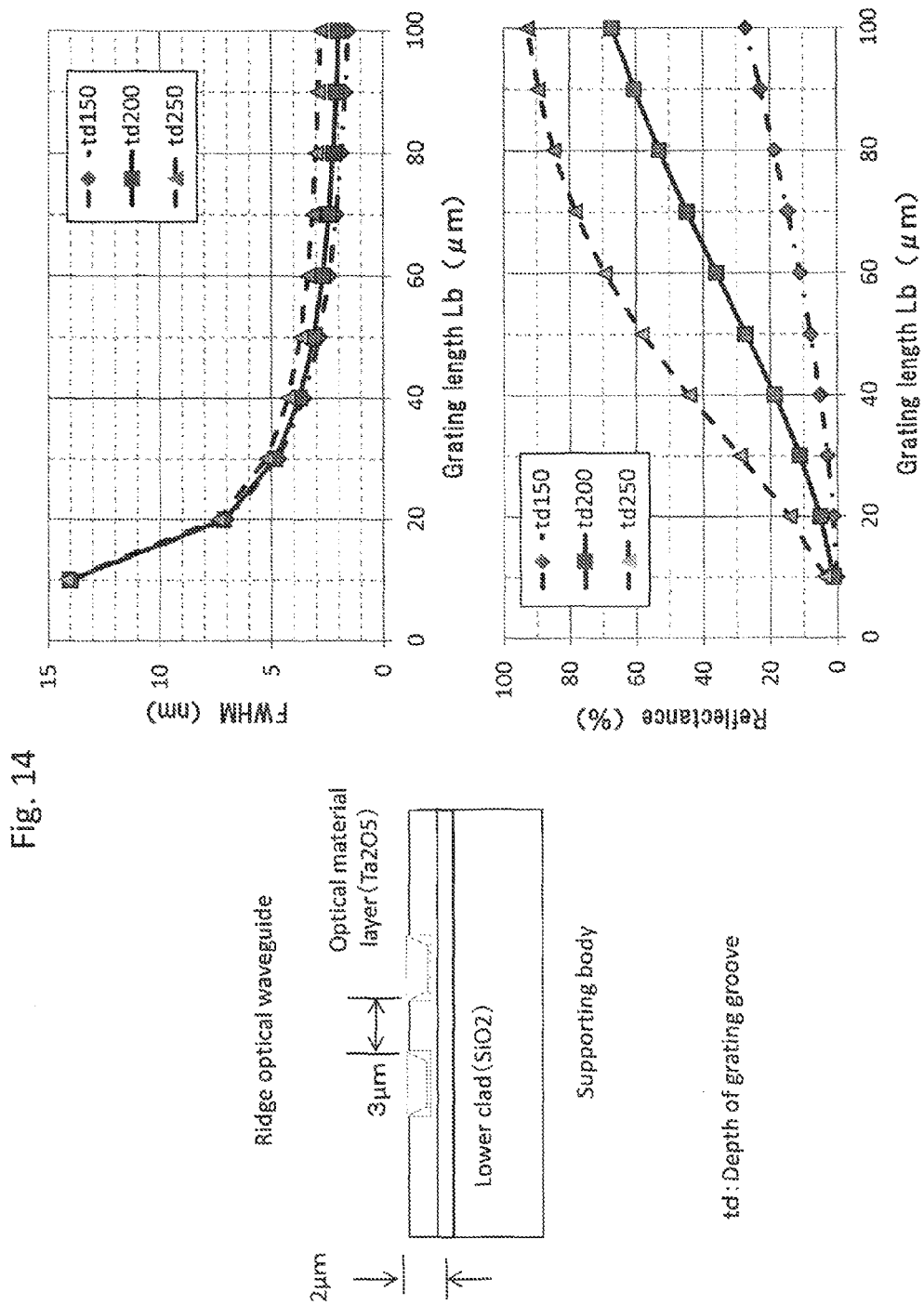
FIG. 14 shows calculated values of the grating reflectance and the half value width of reflection characteristics with respect to the grating length according to the structure concerning FIG. 2 and FIG. 7(b) in Example 1.

FIG. 14 shows calculated values of grating reflectances and half value widths of the reflection characteristic with respect to the grating length according to the structures shown in FIGS. 2 and 7(b). The grating groove depths td were set at 150 nm, 200 nm and 250 nm, respectively.

Ta2O5 was used to form the optical material layer, quartz was used to form the supporting substrate, and SiO2 was used to form the upper side clad layer and lower side clad layer.

As to the optical waveguide structure, the optical material layer has a thickness of 2 μm; the ridge waveguide has a width (upper most end) of 3 μm; and the ridge groove has a depth of 1 μm. The wavelength was set at 850 nm.

As a result, for example, in the case of a grating length of 40 μm at a grating depth td of 200 nm, characteristics of a reflectance of 19% and a half value width of 3.8 nm can be obtained.

Example 2

The light-emitting device as shown in FIGS. 2 and 7(b) was produced.

Specifically, a 0.5 μm thick SiO2 layer as a lower side buffer layer 13 was formed on a supporting substrate 6 formed from quartz by a sputtering apparatus, and a 1.2 μm thick Ta2O5 film was formed thereon to form an optical material layer 30. Next, Ti was film-formed on the optical material layer to prepare grating patterns with an EB lithography apparatus. Then, Ti patterns were used as a mask, and two Bragg gratings G1 and G2 having a pitch interval Λ of 206 nm and a length Lb of 25 μm and a pitch interval Λ of 207 nm and a length Lb of 25 μm, respectively, were formed by fluorine-based reactive ion etching. The length of the intermediate propagating portion 10 was 5 μm. The grating groove was set to have a depth td of 125 nm.

Further, in order to form an optical waveguide, reactive ion etching was carried out by the same method as described above to form a ridge shape of a width Wm of 3 μm and a Tr of 0.6 μm.

A 0.5 μm thick SiO2 layer as an upper side buffer layer 14 was lastly formed by sputtering.

Thereafter, the resulting was cut in the form of bars by a dicing apparatus; both end faces thereof were subjected to optical polishing; AR coat of 0.1% was formed on each of the both end faces; and chip cutting was lastly carried out to produce the grating element. The element size was set to a width of 1 mm and a length Lwg of 500 μm.

As to optical characteristics of the grating element, a super luminescence diode (SLD) as a wide band wavelength light source was used, and output light was analyzed with an optical spectrum analyzer by inputting light in the TE mode to the grating element to evaluate reflection characteristics from the transmission characteristics. The reflection central wavelengths of measured grating elements were 846 nm and 850 nm, respectively, and reflectance thereof was 18%. Further, the reflection characteristics of the two were crossed at a reflectance of 14%, and it was confirmed that the wavelength region at a reflectance of 14% or more was an 8 nm region ranging from 844 nm to 852 nm.

Next, in order to evaluate characteristics of the external resonator type laser in which this grating element was used, the laser module was mounted as shown in FIGS. 2 and 11. As a light source element, a GaAs system laser structure was included; high reflection film was provided on one end face; and the reflectance at the other emitting end face was 10%.
Light Source Element Specification:

| Central wavelength: | 844 nm |
|---|---|
| Output power | 20 mW |
| Half value width: | 50 nm |
| Laser element length: | 250 μm |

Mounting Specification:

| Lg: | 0.5 μm |
|---|---|
| Lm: | 10 μm |

When being driven under the current control (ACC) without using a Pertier element after mounting the module, laser oscillation occurred at a central wavelength of 844 nm at a temperature of 15° C., and an output power of 15 mW was obtained. Next, in order to evaluate the operation temperature range, the module was set in a thermostatic bath to measure the temperature dependency of the laser oscillation wavelength, and the fluctuation of output power thereof. As a result, laser oscillation stably occurred up to an oscillation wavelength of 852 nm and a temperature of 65° C. Though the mode hopping is produced in this temperature region, the fluctuation of output power was within 1%.

Comparative Example 1

The light-emitting device as shown in FIGS. 3 and 7(b) was produced.

Specifically, a 0.5 μm thick SiO2 layer as a lower side buffer layer 13 was formed on a supporting substrate formed from quartz by a sputtering apparatus, and a 1.2 μm thick Ta2O5 film was formed thereon to form an optical material layer 30. Next, Ti was film-formed on the optical material layer 30 to prepare grating patterns with an EB lithography apparatus. Then, Ti patterns were used as a mask, and Bragg grating G1 having a pitch interval Λ of 206 nm and a length Lb of 25 μm was formed by fluorine-based reactive ion etching. The grating groove was set to have a depth td of 125 nm.

Further, in order to form an optical waveguide, reactive ion etching was carried out by the same method as described above to form a ridge shape of a width Wm of 3 μm and a Tr of 0.6 μm. A 0.5 μm thick SiO2 layer as an upper side buffer layer 14 was lastly formed by sputtering.

Thereafter, the resulting was cut in the form of bars by a dicing apparatus; both end faces thereof were subjected to optical polishing; AR coat of 0.1% was formed on each of the both end faces; and chip cutting was lastly carried out to produce the grating element. The element size was set to a width of 1 mm and a length Lwg of 500 μm.

As to optical characteristics of the grating element, a super luminescence diode (SLD) as a wide band wavelength light source was used, and output light was analyzed with an optical spectrum analyzer by inputting light in the TE mode to the grating element to evaluate reflection characteristics from the transmission characteristics. The reflection central wavelength of the measured grating element was 846 nm, and reflectance thereof was 18%.

Next, in order to evaluate characteristics of the external resonator type laser in which this grating element was used, the laser module was mounted as shown in FIGS. 2 and 11. As a light source element, a GaAs system laser structure was included; high reflection film was provided on one end face; and the reflectance at the other emitting end face was 10%.
Light Source Element Specification:

| Central wavelength: | 844 nm |
|---|---|
| Output power | 20 mW |
| Half value width: | 50 nm |
| Laser element length: | 250 μm |

Mounting Specification:

| Lg: | 0.5 μm |
|---|---|
| Lm: | 10 μm |

When being driven under the current control (ACC) without using a Pertier element after mounting the module, laser oscillation occurred at a central wavelength of 844 nm at a temperature of 15° C., and an output power of 15 mW was obtained. Next, in order to evaluate the operation temperature range, the module was set in a thermostatic bath to measure the temperature dependency of the laser oscillation wavelength, and the fluctuation of output power thereof. As a result, laser oscillation stably occurred up to an oscillation wavelength of 849 nm and a temperature of 55° C. Though the mode hopping was produced in this temperature region, the fluctuation of output power was within 1%.

Example 3

The same light-emitting device as described in Example 2 was produced.

However, as to the gratings, two Bragg gratings G1 and G2 having a pitch interval Λ of 206 nm and a length Lb of 25 μm and a pitch interval Λ of 207 nm and a length Lb of 25 μm, respectively, were formed. The length of the intermediate propagating portion 10 was set to 0 μm. Further, other parameters were set to the same parameters as described in Example 2.

As to optical characteristics of the grating element, a super luminescence diode (SLD) as a wide band wavelength light source was used, and output light was analyzed with an optical spectrum analyzer by inputting light in the TE mode to the grating element to evaluate reflection characteristics from the transmission characteristics. The reflection central wavelengths of measured grating elements were 846 nm and 850 nm, respectively, and reflectance thereof was 18%. Further, the reflection characteristics of the two were crossed at a reflectance of 14%, and it was confirmed that the wavelength region at a reflectance of 14% or more was an 8 nm region ranging from 844 nm to 852 nm.

Next, in order to evaluate characteristics of the external resonator type laser in which this grating element was used, the laser module was mounted as shown in FIGS. 2 and 11. As a light source element, a GaAs system laser structure was included; high reflection film was provided on one end face; and the reflectance at the other emitting end face was 14.5%.
Light Source Element Specification:

| Central wavelength: | 844 nm |
|---|---|
| Output power | 20 mW |
| Half value width: | 50 nm |
| Laser element length: | 250 μm |

Mounting Specification:

| | |
|---|---|
| Lg: | 0.5 μm |
| Lm: | 10 μm |

When being driven under the current control (ACC) without using a Pertier element after mounting the module, laser oscillation occurred at a central wavelength of 844 nm at a temperature of 15° C., and an output power of 15 mW was obtained. Next, in order to evaluate the operation temperature range, the module was set in a thermostatic bath to measure the temperature dependency of the laser oscillation wavelength, and the fluctuation of output power thereof. As a result, laser oscillation stably occurred up to an oscillation wavelength of 852 nm and a temperature of 65° C. Though the mode hopping is produced in this temperature region, the fluctuation of output power was within 1%.

The invention claimed is:

1. An external resonator type light-emitting device comprising a light source oscillating a semiconductor laser light and a grating element configuring an external resonator together with said light source:
   wherein said light source comprises an active layer oscillating said semiconductor laser light;
   wherein said grating element comprises an optical waveguide and a plurality of Bragg gratings formed in said optical waveguide,
   said optical waveguide comprising an incident face to which said semiconductor laser light is incident and an emitting face from which an emitting light having a desired wavelength is emitted, said emitting light is of a single mode;
   wherein said Bragg gratings have wavelength regions, respectively, in which reflectances of said Bragg gratings are higher than a reflectance at an emitting end of said light source, respectively;
   wherein said wavelength regions of said Bragg gratings having central wavelengths adjacent to each other are continuous;
   wherein said Bragg gratings adjacent to each other are continuously formed without providing a propagating portion with no diffraction grating between said Bragg gratings adjacent to each other;
   wherein a distance between a reflection end opposite to said emitting end of said light source and an emitting side end point of said Bragg gratings is 500 μm or less;
   wherein a material forming said Bragg gratings has a refractive index nb of 1.7 or more:
   wherein said optical waveguide has a width of 0.5 μm or more and 3.0 μm or less; and
   wherein the following formulae (2) and (3) are satisfied:

$$L_{btotal} \leq 500 \text{ μm} \qquad (2)$$

$$La \leq 500 \text{ μm} \qquad (3)$$

where $L_{btotal}$ represents a length from a start point of said Bragg gratings to said emitting side end point in the formula (2), and
   La represents a length of said active layer in the formula (3).

2. The device of claim 1,
   wherein said reflectances of said Bragg gratings having said central wavelengths adjacent to each other are equal to each other at predetermined wavelengths, respectively, and
   wherein a minimum value of a grating reflectance necessary for laser oscillation in an external resonator mode is not less than said reflectance at said emitting end of said light source, and is not more than each of said reflectances of said Bragg gratings at said predetermined wavelengths.

3. The device of claim 1, satisfying the following formula (1):

$$\lambda g(n+1) - \lambda g(n) \leq \{\Delta\lambda G(n+1) + \Delta\lambda Gn\} \times \frac{1}{2} \qquad (1)$$

where, in the formula (1), $\{\lambda g(n+1) - \lambda g(n)\}$ represents an interval between said central wavelength $\lambda g(n)$ of each Bragg grating Gn and said central wavelength $\lambda g(n+1)$ of said Bragg grating G(n+1) adjacent to said Bragg grating Gn, and
   $\{\Delta\lambda G(n+1) + \Delta\lambda Gn\}$ represents a sum of a half value width $\Delta\lambda Gn$ of said reflectances of said Bragg grating Gn and a half value width $\Delta\lambda G(n+1)$ of said reflectances of said Bragg grating G(n+1) adjacent to said Bragg grating Gn.

4. The device of claim 1, wherein the following formula (4) is satisfied:

$$2 \text{ nm} \leq \Delta\lambda Gn \leq 6 \text{ nm} \qquad (4),$$

where $\Delta\lambda Gn$ represents a half value width of each wavelength characteristic of said reflectances of each of said Bragg gratings, in the formula (4).

5. The device of claim 1,
   wherein said optical waveguide includes an incident side propagating portion provided between said Bragg gratings and said incident face, and
   wherein said incident side propagating portion includes a tapered portion in which a width of said optical waveguide varies.

6. The device of claim 1, further comprising a reflection film formed on an end face on the side of said grating element of said active layer of said light source.

* * * * *